US006570552B2

United States Patent
Yamazaki

(10) Patent No.: US 6,570,552 B2
(45) Date of Patent: May 27, 2003

(54) SEMICONDUCTOR DEVICE AND MANUFACTURING METHOD THEREOF

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 64 days.

(21) Appl. No.: 09/753,410

(22) Filed: Jan. 2, 2001

(65) Prior Publication Data

US 2002/0047825 A1 Apr. 25, 2002

Related U.S. Application Data

(63) Continuation of application No. 09/141,778, filed on Aug. 27, 1998, now Pat. No. 6,197,624.

(30) Foreign Application Priority Data

Aug. 29, 1997 (JP) .............................................. 9-249817
Sep. 3, 1997 (JP) .............................................. 9-254258

(51) Int. Cl.$^7$ ................................................ G09G 3/36
(52) U.S. Cl. ......................................... 345/98; 345/204
(58) Field of Search .............................. 345/87, 88, 98, 345/93, 100, 204, 206; 349/149–152

(56) References Cited

U.S. PATENT DOCUMENTS

| 4,779,083 A | * | 10/1988 | Ishii et al. | |
| 5,140,312 A | * | 8/1992 | Ishii | |
| 5,397,718 A | * | 3/1995 | Furuta et al. | 438/158 |
| 5,536,950 A | * | 7/1996 | Liu et al. | 257/59 |
| 5,567,959 A | * | 10/1996 | Mineji | 257/69 |
| 5,591,650 A | * | 1/1997 | Hsu et al. | 438/163 |
| 5,623,279 A | * | 4/1997 | Itajura et al. | 345/98 |
| 5,643,826 A | | 7/1997 | Ohtani et al. | 437/88 |
| 5,648,277 A | | 7/1997 | Zhang et al. | 437/21 |
| 5,729,308 A | * | 3/1998 | Yamazaki et al. | 349/39 |
| 5,789,762 A | * | 8/1998 | Koyama et al. | 257/66 |
| 5,808,321 A | * | 9/1998 | Mitanaga et al. | 257/72 |
| 5,821,137 A | * | 10/1998 | Wakai et al. | 438/163 |
| 5,837,619 A | * | 11/1998 | Adachi et al. | 438/795 |
| 5,854,494 A | * | 12/1998 | Yamazaki et al. | 257/57 |
| 5,880,707 A | * | 3/1999 | Artani et al. | 345/100 |
| 5,903,014 A | | 5/1999 | Ino et al. | |
| 5,909,205 A | * | 6/1999 | Furuhashi et al. | 345/98 |
| 5,923,963 A | * | 7/1999 | Yamanaka | 438/157 |
| 6,031,249 A | * | 2/2000 | Yamazaki et al. | 257/66 |
| 6,091,115 A | * | 7/2000 | Ohtani et al. | 257/369 |
| 6,262,704 B1 | * | 7/2001 | Kurumisawa et al. | 345/98 |
| 6,388,652 B1 | * | 5/2002 | Yamazaki et al. | 345/98 |

FOREIGN PATENT DOCUMENTS

| JP | 7-130652 | 5/1995 |
| JP | 7-135318 | 5/1995 |
| JP | 8-078329 | 3/1996 |

OTHER PUBLICATIONS

Sze, "Semiconductor Devices Physics and Technology", John Wiley & Sons, pp. 417–419, 1985.
Hayashi, et al., "Fabrication of Low–Temperature Botton–Gate Poly–Si TFTs on Large–Area Substrate by Linear–Beam Excimer Laser Crystallization and Ion Doping Method", IEDM 95, pp. 829–832.
S. Wolf and R.N. Tauber, Silicon Processing, vol. 1., Lattice Press, p. 225, Dec., 1986.*

* cited by examiner

Primary Examiner—Regina Liang
(74) Attorney, Agent, or Firm—Fish & Richardson P.C.

(57) ABSTRACT

This invention is related to a method for controlling a threshold voltage of a bottom gate type thin film transistor as follows. Gate electrodes and a gate insulating film are formed on a glass substrate. An amorphous silicon film is formed thereon and then crystallized into a crystalline silicon film. After a buffer layer is formed thereon, an impurity element (selected from Group 13 or Group 15 elements) for a threshold voltage control is added to the crystalline silicon film by ion implantation or ion doping.

32 Claims, 19 Drawing Sheets

SEMICONDUCTOR DEVICE AND MANUFACTURING METHOD THEREOF

This is a continuation of U.S. application Ser. No. 09/141,778, filed Aug. 2, 1998 now U.S. Pat. No 6,197,624 B1.

BACKGROUND OF THE INVENTION

1. Field of the Invention

The present invention relates to a semiconductor device manufactured by using a semiconductor thin film and a manufacturing method thereof. More specifically, the invention relates to a thin-film transistor (TFT) having a bottom-gate structure as typified by an inverted staggered structure.

In this specification, the term "semiconductor device" includes all devices capable of operation by utilizing semiconductor characteristics. That is, all of TFTs, electro-optical devices, semiconductor circuits, electronic apparatuses, and the like that are described in this specification fall under the category of the semiconductor device.

2. Description of the Related Art

The demand for active matrix liquid crystal display devices has increased rapidly in recent years, and it is now urgently needed to develop techniques for forming thin-film transistors (hereinafter abbreviated as TFTs) by using a semiconductor thin film formed on a glass or quartz substrate. The TFTs are used as switching elements for image display.

TFTs, which are formed on the same substrate as a group of as many as one million several hundred thousand pieces, should have given electrical characteristics depending on the function of an electrical circuit to form. Among those electrical characteristics of a TFT is a parameter called the threshold voltage (Vth).

The threshold voltage is defined as a voltage at which an inversion layer is formed in the channel portion of a TFT. That is, the threshold voltage is a voltage at which a TFT is switched from an off state to an on state. Therefore, it can be said that a TFT having a higher threshold voltage has a higher operating voltage.

There is a problem that the threshold voltage is varied by various extraneous factors such as contamination impurities in the active layer, fixed and mobile charges in the gate insulating film, interface states at the interface between the active layer and the gate insulating film, and a work function difference between the gate electrode and the active layer. Although the introduction of contamination impurities into the active layer and mobile charges into the gate insulating film can be prevented by cleaning a processing environment, fixed charges, interface states, and a work function difference are determined by the materials of the device and hence cannot be changed easily.

The above-mentioned extraneous factors may shift the threshold voltage to the plus or minus side. For example, if the threshold voltage of an NTFT becomes unusually low, there may occur a problem that current flows even in a state that the TFT should be kept off (i.e., in a state that no gate voltage is applied). This is called a normally-on state.

Especially, with respect to a TFT in which a laser crystallized amorphous semiconductor thin film is used for an active layer (so called low-temperature polysilicon TFT), threshold voltages of the NTFT and the PTFT are unusually high (4 to 6 V for the NTFT, −5 to −7 V for the PTFT), which is a serious problem.

A technique called the channel doping is known as a means for solving the above problem. The channel doping is a technique of obtaining a desired threshold voltage by forcibly shifting the threshold voltage by doping the active layer with an impurity at a proper concentration.

Examples of impurities used for the channel doping include Group 13 elements of B (boron), Ga (gallium), and In (indium) and group-15 elements of P (phosphorus), As (arsenic), and Sb (antimony).

SUMMARY OF THE INVENTION

An object of the present invention is to provide a technique for performing channel doping on a bottom-gate TFT (typified by an inverted staggered structure TFT).

Another object of the invention is to provide a semiconductor device including a plurality of bottom-gate TFTs of the invention and a manufacturing method thereof.

The invention provides a semiconductor device including a plurality of bottom-gate TFTs formed on a substrate having an insulating surface, wherein an impurity element for a threshold voltage control has been intentionally added to a channel forming region of at least an n-channel TFT or TFTs among the plurality of bottom-gate TFTs, and wherein the concentration of the impurity element in the channel forming region decreases as the position approaches an interface where the channel forming region and a gate insulating film are in contact with each other.

According to another aspect of the invention, there is provided a semiconductor device including a plurality of bottom-gate TFTs formed on a substrate having an insulating surface, wherein an element selected form Group 15 elements has been intentionally added to a channel forming region of an NTFT and an element selected form Group 13 elements has been intentionally added to a channel forming region of a PTFT among the plurality of bottom-gate TFTs, and wherein the concentrations of the elements in the channel forming regions decrease as the position approaches an interface where the channel forming region and a gate insulating film are in contact with each other.

According to another aspect of the invention, there is provided a manufacturing method of a semiconductor device including a plurality of bottom-gate TFTs formed on a substrate having an insulating surface, comprising the steps of: forming an amorphous silicon film; irradiating the amorphous silicon film with laser light or strong light having intensity equivalent to that of the laser light, to thereby convert the amorphous silicon film into a crystalline silicon film; adding an impurity element for a threshold voltage control to all or part of the crystalline silicon film; and activating the impurity element.

According to a further aspect of the invention, there is provided a manufacturing method of a semiconductor device including a plurality of bottom-gate TFTs formed on a substrate having an insulating surface, comprising the steps of forming an amorphous silicon film; adding an impurity element for a threshold voltage control to all or part of the amorphous silicon film; and irradiating the amorphous silicon film with laser light or strong light having intensity equivalent to that of the laser light, to thereby convert the amorphous silicon film into a crystalline silicon film and, at the same time, activate the impurity element.

According to still another aspect of the invention, there is provided a manufacturing method of a semiconductor device including a plurality of bottom-gate TFTs formed on a substrate having an insulating surface, comprising the steps of forming an amorphous silicon film; holding adjacent to or adding to all or part of the amorphous silicon film a catalyst element for accelerating crystallization of the amorphous silicon film; performing a first heat treatment to convert all or part of the amorphous silicon film into a crystalline silicon film; adding an impurity element for a threshold voltage control selectively to the crystalline silicon film; introducing an element selected form Group 15 elements selectively into the crystalline silicon film; and performing a second heat treatment to move the catalyst element to a region where the element selected from Group 15 elements is introduced and have the catalyst element gettered there and, at the same time, activate the impurity element for a threshold voltage control.

According to another aspect of the invention, there is provided a manufacturing method of a semiconductor device including a plurality of bottom-gate TFTs formed on a substrate having an insulating surface, comprising the steps of: forming an amorphous silicon film; irradiating the amorphous silicon film with laser light or strong light having intensity equivalent to that of the laser light, to thereby convert the amorphous silicon film into a crystalline silicon film; adding an element selected form Group 15 elements to a region to become an NTFT after the crystalline silicon film is obtained; adding an element selected form Group 13 elements to a region to become a PTFT after the crystalline silicon film is obtained; and activating the elements selected from Group 15 and Group 13 elements.

According to a further aspect of the invention, there is provided a manufacturing method of a semiconductor device including a plurality of bottom-gate TFTs formed on a substrate having an insulating surface, comprising the steps of: forming an amorphous silicon film; adding an element selected form Group 15 elements to a region to become an NTFT after the amorphous silicon film is obtained; adding an element selected form Group 13 elements to a region to become a PTFT after the amorphous silicon film is obtained; and irradiating the amorphous silicon film with laser light or strong light having intensity equivalent to that of the laser light, to thereby convert the amorphous silicon film into a crystalline silicon film and, at the same time, activate the elements selected from Group 15 and Group 13 elements.

According to still another aspect of the invention, there is provided a manufacturing method of a semiconductor device including a plurality of bottom-gate TFTs formed on a substrate having an insulating surface, comprising the steps of: forming an amorphous silicon film; holding adjacent to or adding to all or part of the amorphous silicon film a catalyst element for accelerating crystallization of the amorphous silicon film; performing a first heat treatment to convert all or part of the amorphous silicon film into a crystalline silicon film; adding an element selected form Group 15 elements to a region to become an NTFT after the crystalline silicon film is obtained; adding an element selected form Group 13 elements to a region to become a PTFT after the crystalline silicon film is obtained; introducing an element selected form Group 15 elements selectively into a portion of the crystalline silicon film, wherein the portion is not utilized as an active layer; and performing a second heat treatment to move the catalyst element to a portion where the element selected from Group 15 elements is introduced and have the catalyst element gettered there and, at the same time, activate the elements selected from Group 15 and Group 13 elements.

DETAILED DESCRIPTION OF THE PREFERRED EMBODIMENTS

The present invention as summarized above will be described below in detail by using embodiments.

Embodiment 1

This embodiment is directed to a case of manufacturing, by utilizing the invention, a CMOS circuit in which an NTFT (n-channel TFT) and a PTFT (p-channel TFT) are combined together complementarily. In this embodiment, a Group 13 element of boron is added to only the NTFT. As well, this invention can apply to only the PTFT in forming the CMOS circuit.

Figure 1A:
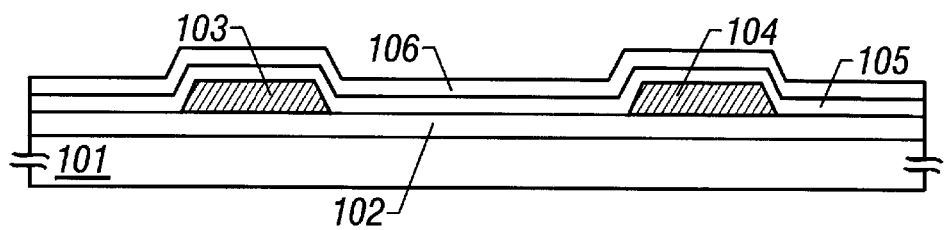
FIGS. 1A–1D and 2A–2E show a manufacturing process of thin-film transistors according to a first embodiment of the present invention.

First, referring to FIG. 1A, a silicon oxide film as an underlayer film 102 is formed on a glass substrate and gate electrodes 103 and 104 are formed thereon. Although in this embodiment the gate electrodes 103 and 104 are a chromium film of 200 to 400 nm in thickness, they may be made of an aluminum alloy, tantalum, tungsten, molybdenum, or the like, or may be a silicon film that is rendered conductive, or the like.

Then, a gate insulating film 105 is formed on the gate electrodes 103 and 104 at a thickness of 100 to 200 nm. The gate insulating film 105 may be a silicon oxide film, a silicon nitride film, or a multilayered film thereof. Alternatively, anodic oxide films formed by anodizing the gate electrodes of aluminum, tantalum, chromium, or the like may be used as the gate insulating films.

Then, an amorphous silicon film 106 is formed at a thickness of 10 to 75 nm (preferably 15 to 45 nm). Other than an amorphous silicon film, a semiconductor thin film having silicon as the main component, such as a silicon-germanium compound represented by $Si_XGe_{1-X}$ (0<X<1), may be used.

After the state of FIG. 1A is obtained in the above manner, the amorphous silicon film 106 is crystallized by irradiating it with laser light or strong light that is as intense as laser light. It is preferable to use excimer laser light as laser light. An excimer laser that is a pulsed laser having KrF, ArF, or XeCl as a light source may be used.

Examples of strong light that is as intense as laser light are strong light emitted from a halogen lamp or a metal halide lamp and strong light emitted from an infrared or ultraviolet lamp.

Figure 1B:
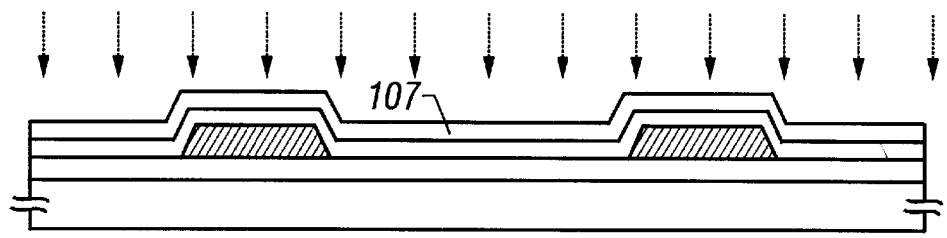

In this embodiment, the amorphous silicon film 106 is crystallized over its entire surface by scanning the substrate from one end to the other with excimer laser light that has been processed to have a linear shape (see FIG. 1B). The laser light sweep speed is set to 1.2 mm/s, the processing temperature is set to the room temperature, the pulse frequency is set to 30 Hz, and the laser energy density is set to 300 to 315 mJ/cm$^2$.

A crystalline silicon film 107 is thus obtained as shown in FIG. 1B. Then, a silicon oxide film as a buffer layer 108 is formed thereon at a thickness of 50 to 200 nm (preferably 100 to 150 nm).

Figure 1C:
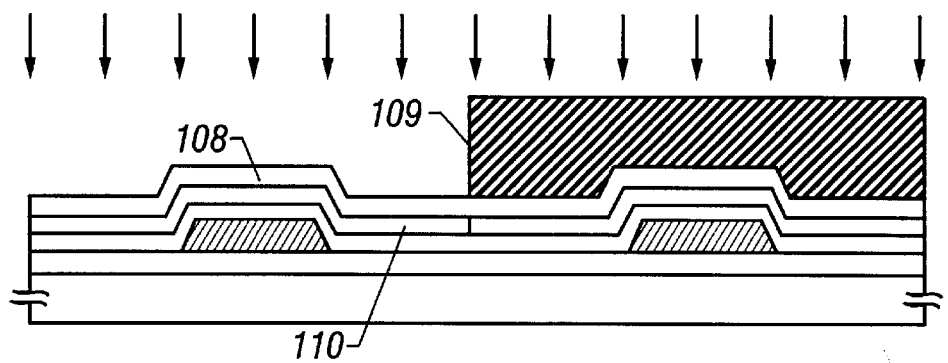

Then, after a region to become a PTFT has been covered with a resist mask 109, boron is added by ion implantation (with mass separation) or ion doping (without mass separation). A boron-containing region 110 is formed by this channel doping step (see FIG. 1C). Another Group 13 element such as indium may be added instead of boron.

The acceleration voltage may be set to a value in a range of 5 to 80 keV (typically 10 to 30 keV) and the dose may be set to a value in a range of $1\times10^{12}$ to $1\times10^{17}$ atoms/cm$^2$ (preferably $1\times10^{13}$ to $1\times10^{16}$ atoms/cm$^2$). In this embodiment, the acceleration voltage and the dose are set to 30 keV and $5\times10^{13}$ atoms/cm$^2$, respectively.

Since the crystalline silicon film 107 is very thin, it is damaged and its crystallinity is lost if ions are implanted into it directly. Further, in implanting ions into a very thin film, it is very difficult to control the impurity concentration.

However, in the embodiment, because of through-doping with interposition via the buffer layer 108, the degree of damage of the crystalline silicon film 107 that is caused by the ion implantation can greatly be reduced. Further, because of the presence of the thick buffer layer 108 above the crystalline silicon film 107, the concentration of the impurity added to the crystalline silicon film 107 can easily be controlled.

It is desirable that the boron concentration profile formed in the crystalline silicon film 107 by the ion implantation be so adjusted that the boron concentration is low in a portion where a channel will be formed (i.e., a portion in the vicinity of the interface between the channel forming region and the gate insulating film 105). Resulting effects will be described later.

After completion of the above impurity element adding step, the buffer layer 108 and the resist mask 109 are removed and then active layers 111 and 112 are formed by again patterning. Thereafter, excimer laser light is applied to repair damage that has been caused by the ion implantation step and to activate added boron atoms (see FIG. 1D).

Figure 2A:
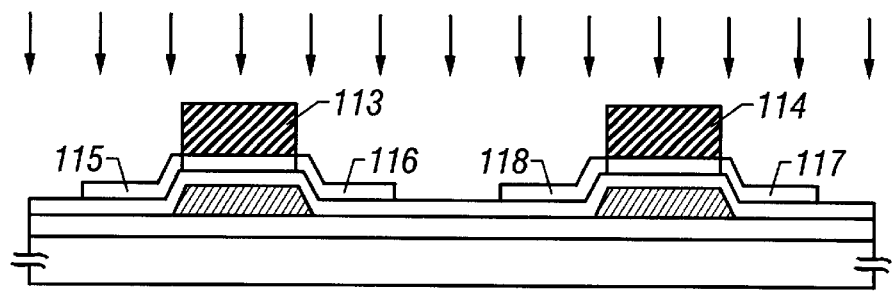

Then, resist masks 113 and 114 are formed by performing back exposure by using the gate electrodes 103 and 104 as masks. Subsequently, low-concentration impurity regions 115 to 118 are formed by adding an impurity element for imparting n-type conductivity (typically phosphorus or arsenic) at a concentration of about $1\times10_{17}$ to $5\times10^{18}$ atoms/cm$^3$ (see FIG. 2A).

After the resist masks 113 and 114 have been removed, resist masks 119 and 120 are formed by patterning. At this time, the PTFT region is completely covered. Then, a source region 121 and a drain region 122 of an NTFT are formed by again adding the impurity element for imparting n-type conductivity at a higher concentration (about $1\times10^{19}$ to $1\times10^{20}$ atoms/cm$^3$) than in the case of FIG. 2A.

Figure 2B:
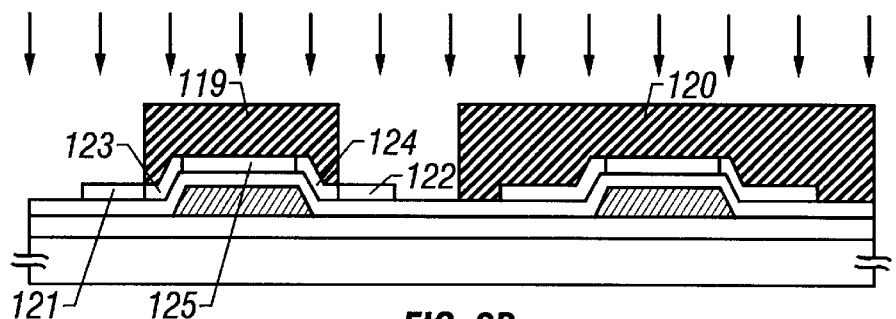

Regions 123 and 124 remain as low-concentration impurity regions and the region 124 will serve as an LDD (lightly doped drain) region. A region 125 becomes a channel forming region (see FIG. 2B).

After the resist masks 119 and 120 have been removed, resist masks 126 and 127 are formed so as to completely cover the NTFT region.

Figure 2C:
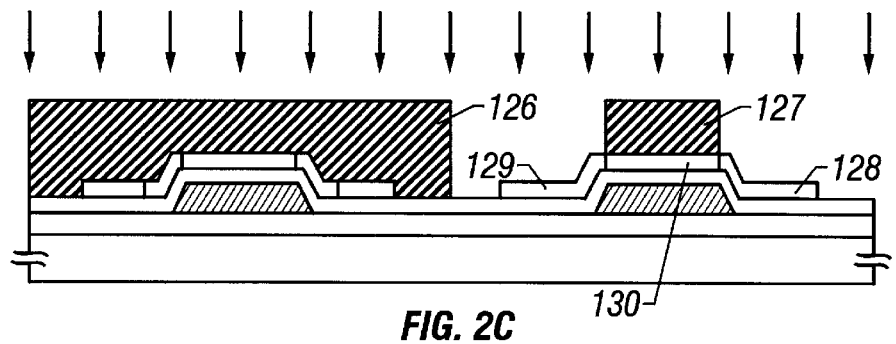

Then, a source region 128 and a drain region 129 of the PTFT are formed by adding an impurity element for imparting p-type conductivity (typically boron or indium) at a concentration of about $1\times10^{19}$ to $1\times10^{20}$ atoms/cm$^3$. A region 130 becomes a channel forming region (see FIG. 2C).

Figure 2D:
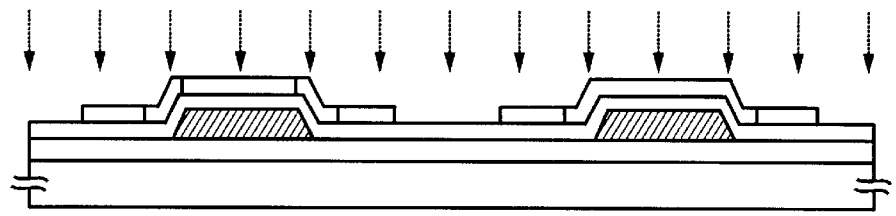

After the resist masks 126 and 127 have been removed, an excimer laser light is applied to repair damage caused by the ion implantation and to activate the added impurity (see FIG. 2D).

After completion of the laser annealing, an interlayer insulating film 131 is formed at a thickness of 300 to 500 nm. The interlayer insulating film 131 may be a silicon oxide film, a silicon nitride film, an organic resin film, or a multilayered film thereof.

Figure 2E:
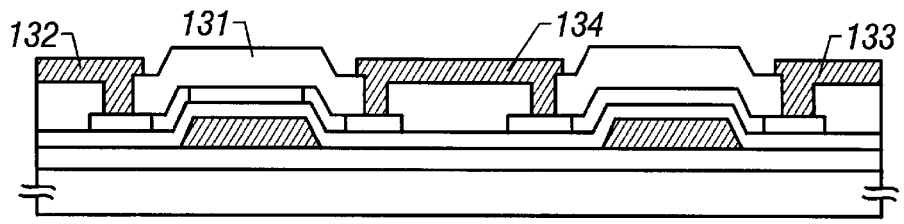

Then, metal thin films as source electrodes 132 and 133 and a drain electrode 134 are formed on the interlayer insulating film 131 (see FIG. 2E). The metal thin films may be made of aluminum, tantalum, titanium, tungsten, or molybdenum, or may be a multilayered film made of those materials. The film thickness may be 100 to 300 nm.

Finally, the entire structure is subjected to a heat treatment at 350° C. for about 2 hours in a hydrogen atmosphere, to terminate dangling bonds in the films (particularly in the channel forming regions). A CMOS circuit having a structure shown in FIG. 2E is thus completed.

According to the manufacturing process of this embodiment, the NTFT has an LDD structure but the PTFT does not. However, this embodiment is just an example of the present invention and the invention can also be applied to other structures. That is, the invention can be applied to all kinds of inverted staggered structure TFTs that are manufactured by known methods. Further, although this embodiment is directed to the CMOS circuit, it goes without saying that the invention can be applied to circuits that are constituted of NTFTs or PTFTs as single elements.

Embodiment 2

This embodiment is directed to a case where a Group 15 element of phosphorus is added in addition to the Group 13 element of boron in the first embodiment of the present invention, a CMOS circuit in which an NTFT (n-channel TFT) and a PTFT (p-channel TFT) are combined together complementarily to anodically oxidize gate electrodes.

Figure 3A:
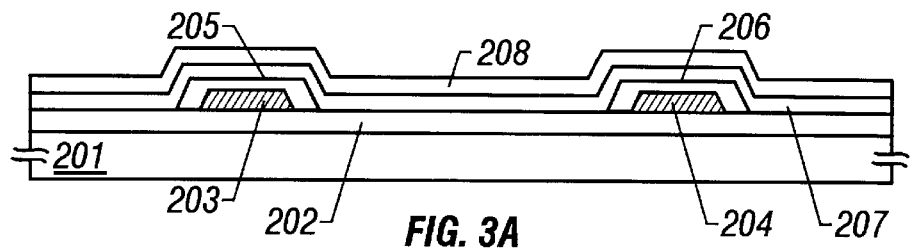
FIGS. 3A–3E and 4A–4E show a manufacturing process of thin-film transistors according to a second embodiment of the invention.

First, referring to FIG. 3A, a silicon oxide film as an underlayer film 202 is formed on a glass substrate 201 and gate electrodes 203 and 204 are formed thereon. In this embodiment, the gate electrodes 203 and 204 are an aluminum alloy (2 wt % of scandium is added to an aluminum) of 200 to 400 nm in thickness. However, they may be made of a chromium, tantalum, tungsten, molybdenum, or conductive polysilicon.

Then, non-porous anodic oxide films with 205 and 206 are formed by anodically oxidizing the gate electrodes 203 and 204 in tartaric acid. Detailed forming method is disclosed in Japanese Patent Laid-Open No. Hei 7-135318. The anodic oxide films 205 and 206 protect the gate electrodes 203 and 204 so that the gate electrodes 203 and 204 can be held against temperatures in later processes. However, in a case where highly heat resisting materials such as tungsten, molybdenum, and polysilicon having conductivity are used as the gate electrodes, there is no need for anodic oxidation.

Then, a gate insulating film 207 is formed on the gate electrodes 203 and 204 at a thickness of 100 to 200 nm. The gate insulating film 207 may be a silicon oxide film, a silicon nitride film, or a multilayered film of those films. Alternatively, anodic oxide films 205 and 206 formed by anodizing the gate electrodes may be used as the gate insulating films.

Then, an amorphous silicon film 208 is formed at a thickness of 10 to 150 nm (preferably 10 to 75 nm, more preferably 15 to 45 nm). Other than an amorphous silicon film, a semiconductor thin film having silicon as the main component, such as a silicon-germanium compound represented by $Si_xGe_{1-x}$ (0<X<1), may be used.

After the state of FIG. 3A is obtained in the above manner, the amorphous silicon film 208 is crystallized by irradiating it with a laser light or a strong light that is as intense as the laser light. It is preferable to use an excimer laser light as the laser light. An excimer laser that is a pulsed laser having KrF, ArF, or XeCl as a light source may be used.

Examples of strong light that is as intense as laser light include strong light emitted from a halogen lamp or a metal halide lamp and strong light emitted from an infrared or ultraviolet lamp.

Figure 3B:
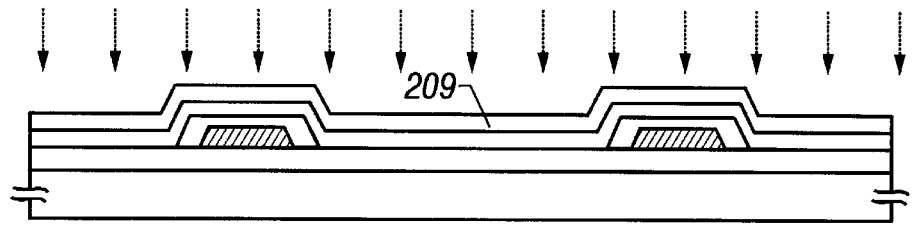

In this embodiment, the amorphous silicon film 208 is crystallized over its entire surface by scanning the substrate from one end to the other with excimer laser light that has been processed to have a linear shape (see FIG. 3B). The laser light sweep speed is set to 1.2 mm/s, the processing temperature is set to the room temperature, the pulse frequency is set to 30 Hz, and the laser energy density is set to 300 to 315 mJ/cm$^2$.

A crystalline silicon film 209 is thus obtained as shown in FIG. 3B. Then, a silicon oxide film as a buffer layer 210 is formed thereon at a thickness of 50 to 200 nm (preferably 100 to 150 nm).

Figure 3C:
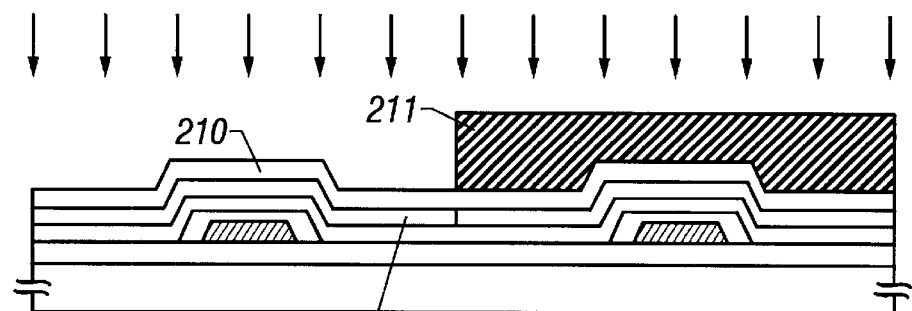

Then, after a region to become a PTFT has been covered with a resist mask 211, phosphorus is added by ion implantation (with mass separation) or ion doping (without mass separation). A phosphorus-containing region 212 is formed by this channel doping step. Another Group 15 element such as arsenic or antimony may be added instead of phosphorus (see FIG. 3C).

The acceleration voltage may be set to a value in a range of 5 to 80 keV (typically 10 to 30 keV) and the dose may be set to a value in a range of $1\times10^{12}$ to $1\times10^{17}$ atoms/cm$^2$ (preferably $1\times10^{13}$ to $1\times10^{16}$ atoms/cm$^2$). In this embodiment, the acceleration voltage and the dose are set to 30 keV and $5\times10^{13}$ atoms/cm, respectively.

It should be noted that the dose should be set in advance. That is, the threshold voltage to shift in a case where channel doping is not performed should be checked, and the dose of phosphorus required to be added to obtain a desired threshold voltage should be calculated beforehand. Therefore, the dose may not be in the range mentioned above.

In this case, since the crystalline silicon film 209 is very thin, it is damaged and its crystallinity is lost if ions are implanted into it directly. Further, in implanting ions into a very thin film, it is very difficult to control the concentration of impurities.

However, in this embodiment, because of through-doping via the buffer layer 210, the degree of damage of the crystalline silicon film 209 that is caused by the ion implantation can be reduced. Further, because of the presence of the thick buffer layer 210 above the crystalline silicon film 209, the concentration of the impurity added to the crystalline silicon film 209 can easily be controlled.

It is desirable that the boron concentration profile formed in the crystalline silicon film 209 by the ion implantation be so adjusted that the boron concentration is low in a portion where a channel will be formed (i.e., a portion in the vicinity of the interface between the channel forming region and the gate insulating film 205). Resulting effects will be described later.

After a Group 15 element has been added to the region to become the NTFT as explained above, the resist mask 211 is removed, and a resist mask 213 covering a region to become the NTFT is formed. Then, an element selected form Group 13 elements (in this embodiment, boron) is added to a region to become a PTFT later. The adding step may be applied to the above-mentioned phosphorus adding step. Other than boron, gallium, indium, or the like is possibly used (FIG. 3D).

Figure 3D:
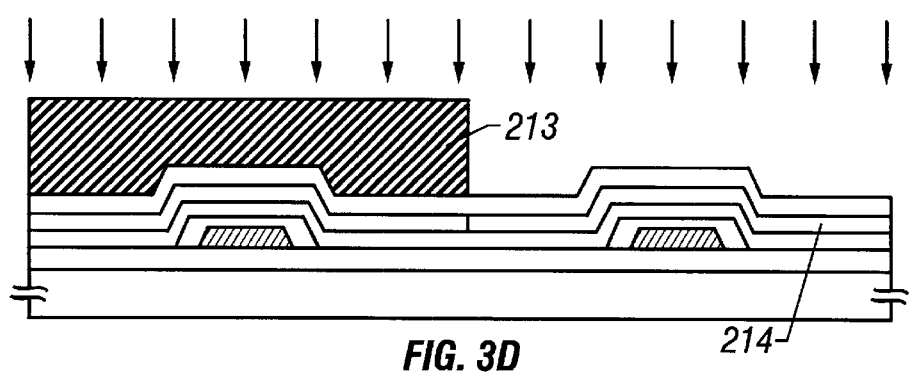

By the step shown in FIG. 3D, a boron-containing region 214 is formed in a region to become the PTFT. As in the above-mentioned Group 15 element adding step, the buffer layer 210 reduces the degree of damage caused by the ion implantation, and the concentration can easily be controlled.

Figure 3E:
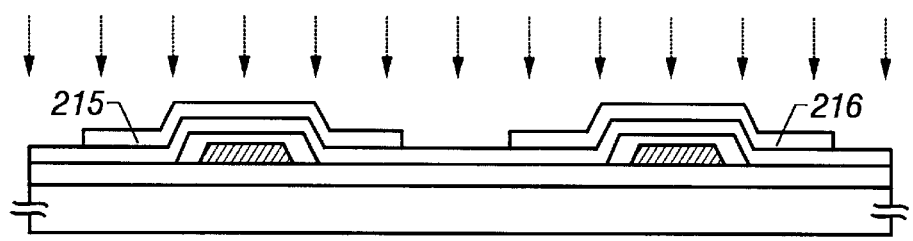

After completion of the above impurity element adding step, the buffer layer 210 and the resist mask 213 are removed and then active layers 215 and 216 are formed by patterning. Thereafter, excimer laser light is applied to repair damage that has been caused by the ion implantation step and to activate added boron atoms (see FIG. 3E).

Figure 4A:
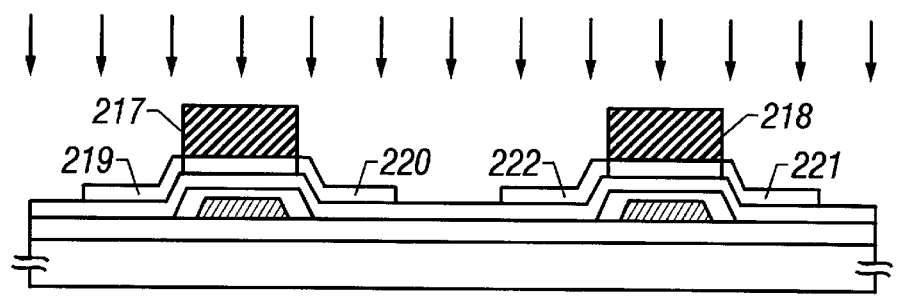

Then, resist masks 217 and 218 are formed by performing back exposure by using the gate electrodes 203 and 204 as masks. Subsequently, low-concentration impurity regions 219 to 222 are formed by adding an impurity element for imparting n-type conductivity (typically phosphorus or arsenic) at a concentration of about $1\times10^{17}$ to $5\times10^{18}$ atoms/cm$^3$ (see FIG. 4A).

After the resist masks 217 and 218 have been removed, resist masks 223 and 224 are formed by again patterning. At this time, the PTFT region is completely covered. Then, a source region 225 and a drain region 226 of an NTFT are formed by again adding the impurity element for imparting n-type conductivity at a higher concentration (about $1\times10^{19}$ to $1\times10^{20}$ atoms/cm$^3$) than in the case of FIG. 4A.

Figure 4B:
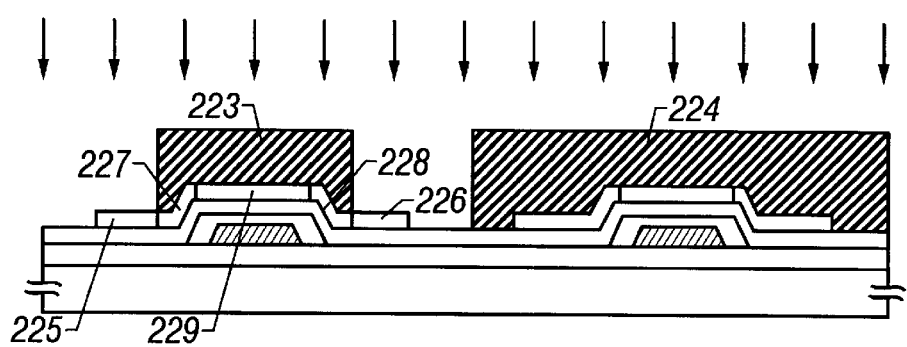

Regions 227 and 228 remain as low-concentration impurity regions and will serve as an LDD (Lightly Doped Drain) region. A region 229 becomes a channel forming region (see FIG. 4B).

After the resist masks 223 and 224 have been removed, resist masks 230 and 231 are formed so as to completely cover the NTFT region.

Figure 4C:
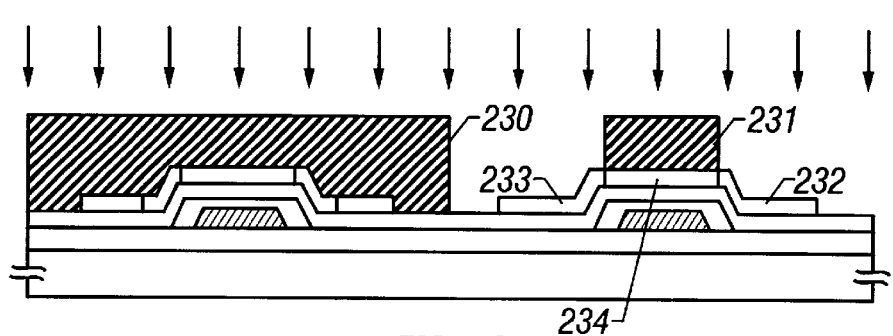

Then, a source region 232 and a drain region 233 of the PTFT are formed by adding an impurity element for imparting p-type conductivity (typically boron, gallium, or indium) at a concentration of about $1\times10^{19}$ to $1\times10^{20}$ atoms/cm$^3$. A region 234 becomes a channel forming region (see FIG. 4C).

Figure 4D:
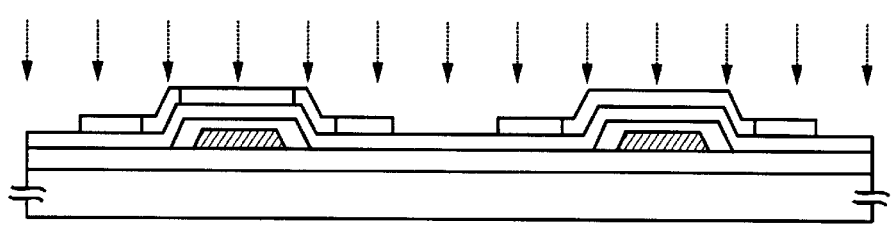

After the resist masks 230 and 231 have been removed, excimer laser light is applied to repair damage caused by the ion implantation and to activate the added impurity (see FIG. 4D).

After completion of the laser annealing, an interlayer insulating film 235 is formed at a thickness of 300 to 500 nm. The interlayer insulating film 235 may be a silicon oxide film, a silicon nitride film, an organic resin film, or a multilayered film thereof.

Figure 4E:
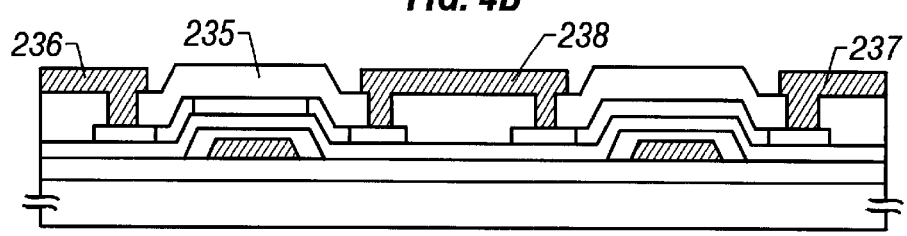

Then, metal thin films as source electrodes 236 and 237 and an n-common drain electrode 238 are formed on the interlayer insulating film 235 (see FIG. 4E). The metal thin films may be made of aluminum, tantalum, titanium, tungsten, or molybdenum, or may be a multilayered film made of those materials. The film thickness may be 100 to 300 nm.

Finally, the entire structure is subjected to a heat treatment at 350° C. for about 2 hours in a hydrogen atmosphere, to terminate dangling bonds in the films (particularly in the channel forming regions). A CMOS circuit having a structure shown in FIG. 4E is thus completed.

Conventionally, in a case that an active layer is a silicon film crystallized by laser crystallization, the threshold voltage of the NTFT shifts to the plus side, and the threshold voltage of the PTFT shifts to the minus side. However, in this embodiment, an element selected form Group 15 elements (having an effect of shifting a threshold voltage to the minus side) is added to the NTFT, and an element selected form Group 13 elements (having an effect of shifting a threshold voltage to the plus side) is added to the PTFT. Therefore, the threshold voltages can be controlled to the desired levels.

Figure 5:
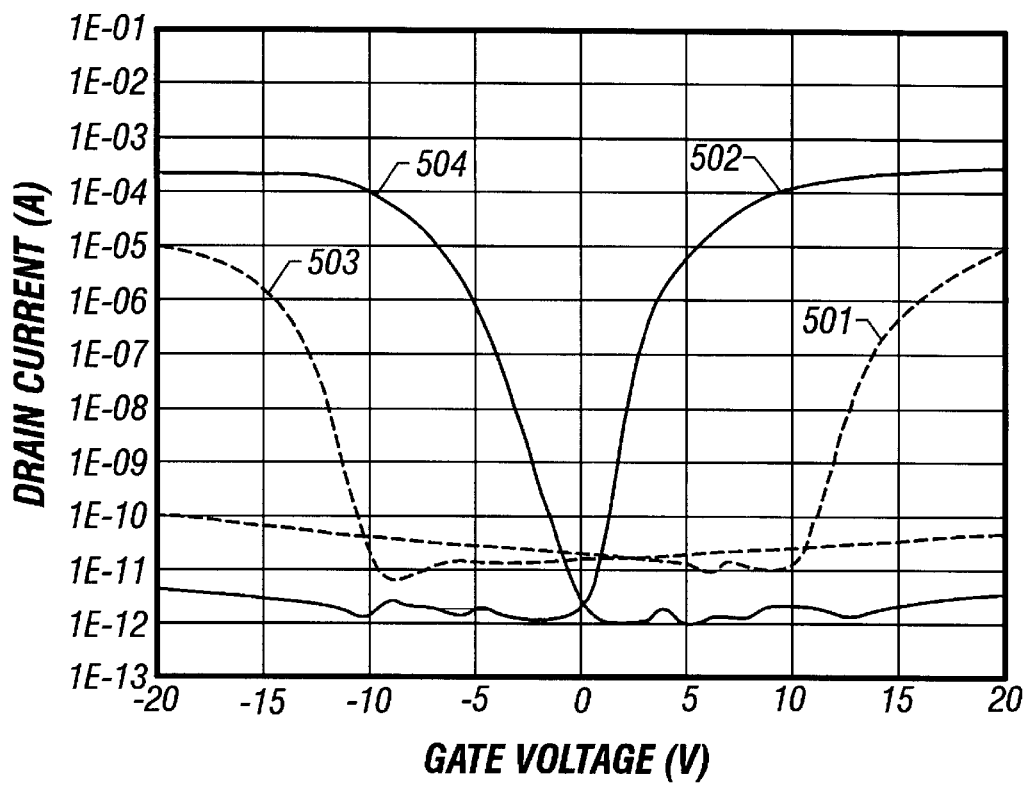
FIG. 5 is a graph showing a TFT characteristics according to the second embodiment of the invention.

This is shown in FIG. 5. In FIG. 5, reference numeral 501 represents Id-Vg characteristics of the NTFT in a case where a threshold voltage is not controlled (a conventional case), and reference numeral 502 represents Id-Vg characteristics of the NTFT according to the present invention. Also, reference numeral 503 represents Id-Vg characteristics of the PTFT in a case where a threshold voltage is not controlled (a conventional case), and reference numeral 504 represents Id-Vg characteristics of the PTFT according to the present invention.

Incidentally, Id indicates drain current, and Vg indicates gate voltage. Such Id-Vg characteristics is generally and broadly used as a guideline to evaluate TFT's electronic characteristics. Therefore, detailed description with respect to Id-Vg characteristics is omitted here.

As clearly shown in FIG. 5, an Id-Vg characteristic of the NTFT which greatly shifts to the plus side in the conventional case as indicated by the reference numeral 501 is adjusted to a very low threshold voltage level as indicated by the reference numeral 502 according to the present invention. Similarly, an Id-Vg characteristic of the PTFT is adjusted to a desired level of threshold voltage.

Further, at this time, according to the invention, by adding appropriate amount of an impurity element for threshold voltage control, the Id-Vg characteristic of the NTFT and the PTFT can be made horizontally symmetry, which is greatly effective for correcting output balance when a CMOS circuit is arranged In this manner, the threshold voltage of the NTFT can be controlled to be in a range of 0.5 to 2.5 V (preferably, 0.5 to 1.5 V), and the threshold voltage of the PTFT can be controlled to be in a range of −0.5 to −2.5 V (preferably, −0.5 to −1.5 V). Further, absolute values of threshold voltages for the NTFT and the PTFT can be 5 V or less (preferably 3 V or less, more preferably 1 V or less). The threshold voltages of both TFTs are controlled to be in a range capable of operating at normally off.

Also, by controlling the threshold voltages, a window width between the NTFT and the PTFT (a gap between the threshold voltages of the NTFT (Vth, n) and the PTFT (Vth, p): Vth,n−Vth,p) can be narrowed (to 1 to 3 V or less, preferably 2 V or less). Therefore, a CMOS circuit with low operating voltage can be realized.

According to the manufacturing process of this embodiment, the NTFT has an LDD structure but the PTFT does not. However, this embodiment is just an example of the present invention and the structure to which the invention can be applied, is not limited.

That is, the invention can be applied to all kinds of inverted staggered structure TFTs that are manufactured by known methods. Further, this embodiment is described in accordance with an example of the CMOS circuit, however, it goes without saying that the structure in which the Grope 15 element is added to the NTFT and the Group 13 element is added to the PTFT can be applied to circuits that are constituted of NTFTs or PTFTs as single elements.

Now, the importance of lowering, in the channel doping step, the boron concentration in the portion where a channel will be formed.

If an impurity element for controlling the threshold voltage exists in a channel at a high concentration, majority carriers (electrons or holes) collide with impurity atoms and are thereby scattered. The impurity scattering caused by carriers is not preferable because it is a factor of reducing the field-effect mobility that dominates the operation speed of the TFT.

In the present invention, since an impurity for controlling the threshold voltage is added from the back side of the portion where a channel will be formed, the impurity concentration of the portion where a channel will be formed can be set lower by utilizing the gradient of the concentration profile. In other words, the concentration of an impurity in the channel forming region has such a gradient as to decrease as the position approaches the interface between the channel forming region and the gate insulating film.

Therefore, although in the channel forming region the impurity element concentration is as high as $1\times10^{17}$ to $1\times10^{20}$ atoms/cm$^3$ in the vicinity of the surface on the side farther from the substrate, it decreases as the position approaches the interface with the gate insulating film and is about ⅓ of the above value or less (typically $1\times10^{16}$ to $5\times10^{18}$ atoms/cm$^3$) in the vicinity of the interface.

However, a concentration distribution in the channel forming region changes in accordance with the thickness of a crystalline silicon film to become a channel forming region. As described above, when the thickness of the channel forming region is in a range of 30 to 50 nm, the impurity concentration value in the vicinity of the interface with the gate insulation film is ⅓ or less of the concentration value in the vicinity of the surface on a side farther from the substrate.

Naturally, as a film becomes thicker, the impurity concentration in the vicinity of the interface with the gate insulating film decreases, and if the thickness is in a range of 50 to 70 nm, the concentration value can be decreased to ⅕ or less, and if the thickness is in a range of 70 to 100 nm, the concentration value can be decreased to ¹⁄₁₀ or less. On the other hand, in a case of thinning a film thickness (for example, approximately 10 to 30 nm), an effect of concentration gradient when an impurity element is added becomes difficult to be realized, and there is a limitation to decrease to ½ or less.

The above concentration gradient is controlled by the ion implantation conditions, and the buffer layer that is formed before the ion implantation facilitates such a precise concentration control.

Controlling the threshold voltage in the above manner so as to minimize the impurity scattering enables driving at a low operating voltage and makes it possible to manufacture a TFT having a high mobility.

The addition of the element selected form Group 15 elements to the NTFT indicates that the absolute amount of the electron that is a majority carrier of the NTFT increases, leading to help the electron move. Therefore, the mobility of the NTFT (field-effect mobility) may be enhanced. On the contrary, when the element selected from Group 13 elements is added to the PTFT, the absolute amount of the holes that are a majority carrier of the PTFT increases. As a result, the mobility is also enhanced.

Incidentally, the mobility can be obtained by substituting the drain current value or the like that can be obtained by measurement of the Id-Vg characteristics for a well-known theoretical equation to calculate a value.

In case of the NTFT where the present invention is not put into practice, i.e., when the channel forming region is undoping, the mobility is 40 to 60 $cm^2/Vs$. In the effect of the present invention, however, the mobility increases up to approximately 70 to 250 $cm^2/Vs$ (representatively 120 to 150 $cm^2/Vs$). Further, while the mobility is 30 to 50 $cm^2/Vs$ in the conventional PTFT, the mobility increases up to approximately 60 to 150 $cm^2/Vs$ (representatively 80 to 100 $cm^2/Vs$), in the effect of the present invention.

Embodiment 3

This embodiment is directed to a case where the step of adding an impurity element for the threshold voltage control and the crystallization step in the first embodiment are switched.

Figure 6A:
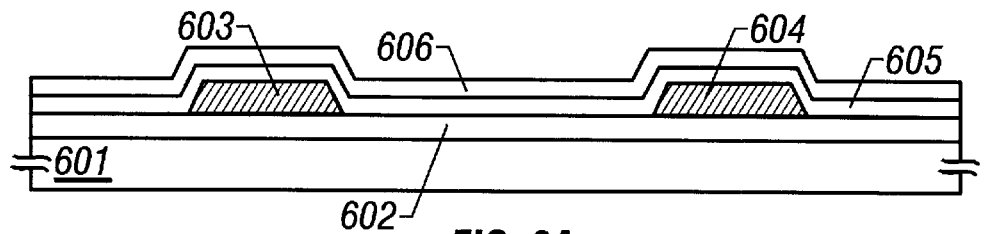
FIGS. 6A–6D show a manufacturing process of thin-film transistors according to a third embodiment of the invention.

In FIG. 6A, reference numeral 601 denotes a glass substrate; 602, an underlayer film; 603 and 604, tantalum films as gate electrodes; 605, a multilayered film as a gate insulating film in which a thin silicon nitride film is formed on a silicon oxide film; and 606, an amorphous silicon film.

Figure 6B:
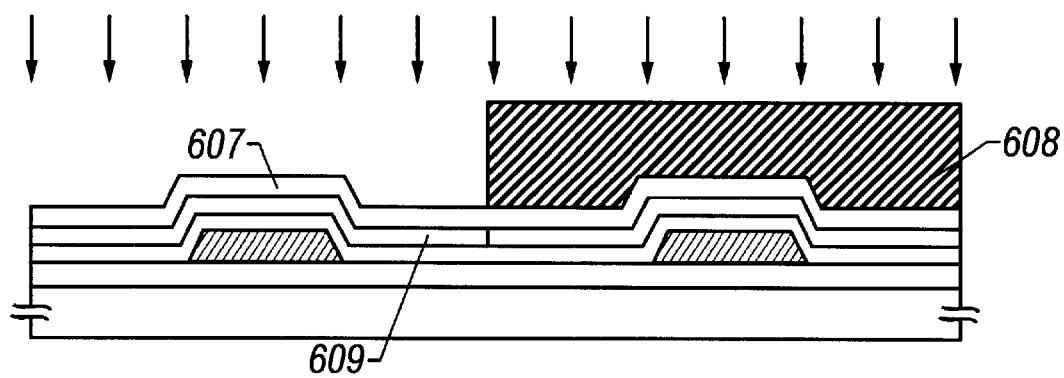

After a buffer layer 607 and a resist mask 608 have been formed, boron is added by ion implantation. The implantation conditions may be the same as in the first embodiment. A boron-containing region 609 is thus formed and the state of FIG. 6B is obtained.

Figure 6C:
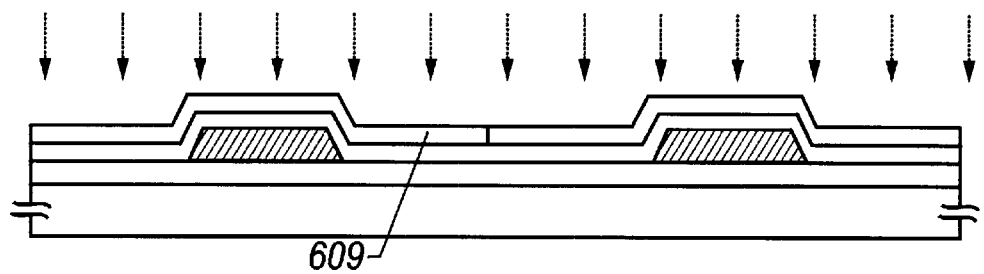

After the buffer layer 607 and the resist mask 608 have been removed, an excimer laser light is applied as shown in FIG. 6C. The irradiation conditions of the excimer laser light may be the same as in the first embodiment.

As a result of this step, the amorphous silicon film 606 is crystallized into a crystalline silicon film 609. At the same time, the boron atoms that were added in the above ion implantation step are activated.

Figure 6D:
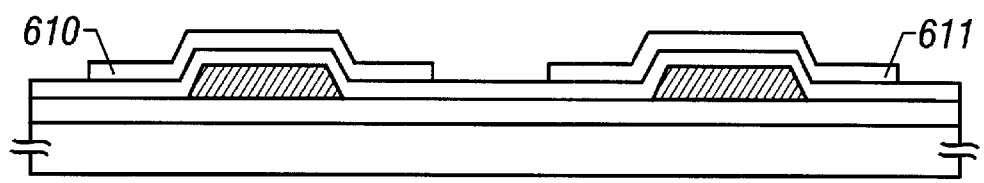

Then, the crystalline silicon film 609 is patterned into island-like to obtain active layers 610 and 611 (see FIG. 6D). By executing the ensuing steps in the same manner as in the first embodiment, the manufacture of a CMOS circuit having the structure shown in FIG. 2E is completed.

Embodiment 4

This embodiment is directed to a case where the step of adding an impurity element for the threshold voltage control and the crystallization step in the second embodiment are switched.

Figure 7A:
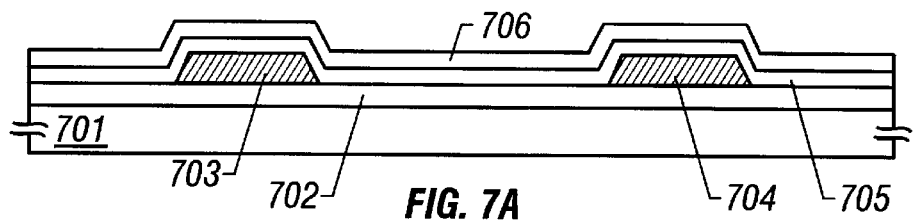
FIGS. 7A–7E show a manufacturing process of thin-film transistors according to a fourth embodiment of the invention.

In FIG. 7A, reference numeral 701 denotes a glass substrate; 702, an underlayer film; 703 and 704, tantalum films as gate electrodes; 705, a multilayered film as a gate insulating film in which a thin silicon nitride film is formed on a silicon oxide film; and 706, an amorphous silicon film. The materials that may be used as the gate electrode are the same as those mentioned in the second embodiment (FIG. 7A).

Figure 7B:
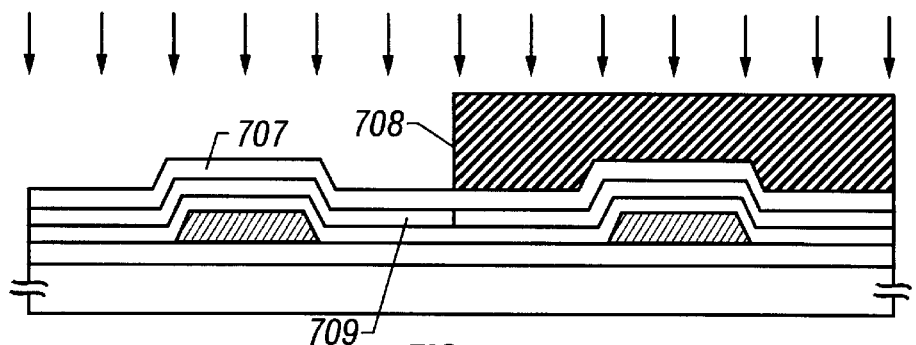

After a buffer layer 707 and a resist mask 708 have been formed, phosphorus element is added by ion implantation. The implantation conditions may be the same as in the second embodiment. A phosphorus-containing region 709 is thus formed and the state of FIG. 7B is obtained.

Figure 7C:
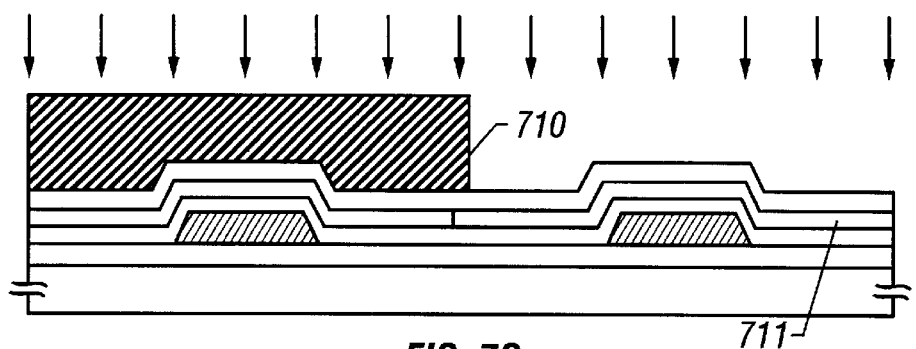

After the resist mask 708 has been removed, a resist mask 710 is again formed and boron is subsequently added. The adding conditions may be the same as in the second embodiment. A boron-containing region 711 is thus formed and the state of FIG. 7C is obtained.

Figure 7D:
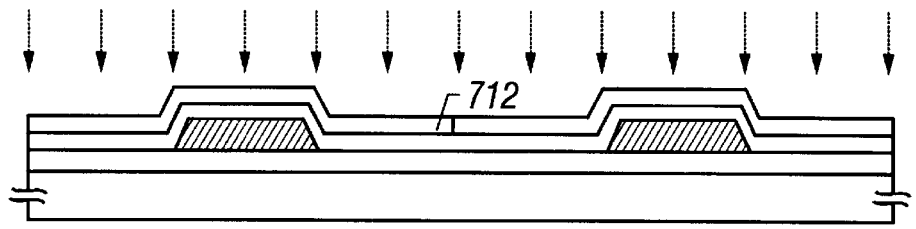
Figure 7E:
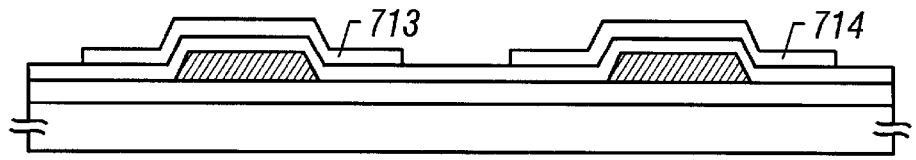

After the buffer layer 707 and the resist mask 710 have been removed, an excimer laser light is applied as shown in FIG. 7D. The irradiation conditions of the excimer laser light may be the same as in the second embodiment.

As a result of this step, the amorphous silicon film 706 is crystallized into a crystalline silicon film 712 At the same time, the boron atoms that were added in the above ion implantation step are activated.

Then, the crystalline silicon film 712 is patterned into island-like to obtain active layers 713 and 714. By executing the ensuing steps in the same manner as in the second embodiment, the manufacture of a CMOS circuit having the structure shown in FIG. 4E is completed.

Embodiment 5

This embodiment is directed to a case of using a catalyst element (typically nickel) for accelerating crystallization in crystallizing an amorphous silicon film.

Figure 8A:
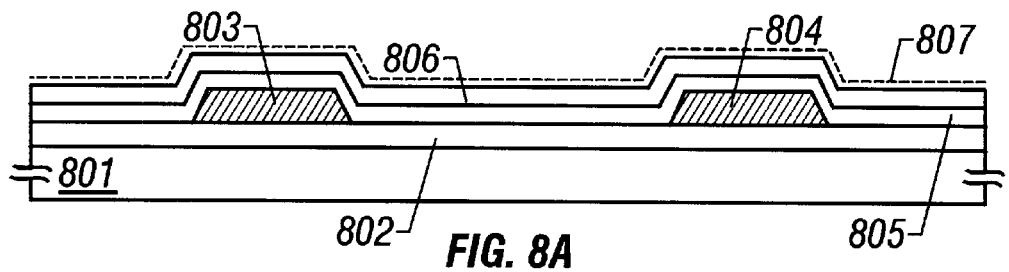
FIGS. 8A–8D show a manufacturing process of thin-film transistors according to a fifth embodiment of the invention.

In FIG. 8A, reference numeral 801 denotes a glass substrate; 802, an underlayer film; 803 and 804, chromium films as gate electrodes; 805, a gate insulating film; and 806, an amorphous silicon film. A detailed description of these components is not made here because it was done in the first embodiment.

In this embodiment, a film 807 containing nickel (hereinafter referred to as a nickel-containing film) is formed on the amorphous silicon film 806 (see FIG. 8A). The nickel-containing film 807 may be formed by using a technique of the present inventors that is disclosed in Japanese Patent Laid-Open No. Hei 7-130652 (particularly the first embodiment).

Examples of the catalyst element other than nickel (Ni) are cobalt (Co), iron (Fe), palladium (Pd), platinum (Pt), copper (Cu), gold (Au), germanium (Ge), and lead (Pb).

Although the above publication describes an example of adding a catalyst element by spin coating, a catalyst element may be added by ion implantation or plasma doping. The latter techniques are effective in constructing a miniaturized circuit because they make it easier to reduce the area occupied by an catalyst element added region and to control the growth length of a lateral growth region.

Figure 8B:
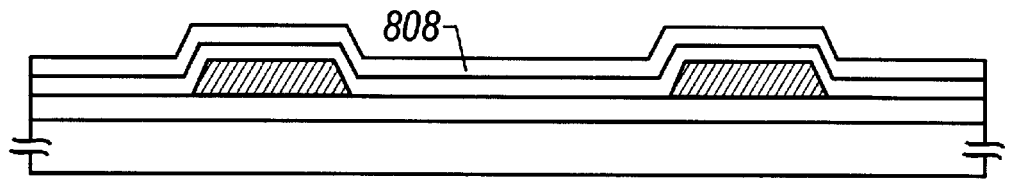

After completion of the catalyst element adding step, hydrogen removal is performed at 500° C. for about 1 hour and then the amorphous silicon film 806 is crystallized by performing a heat treatment (furnace annealing) at 500° to 700° C. (typically 550° to 650° C.) for 4 to 24 hours in an inert atmosphere, a hydrogen atmosphere, or an oxygen atmosphere. In this embodiment, a crystalline silicon film 808 is obtained by performing a heat treatment at 550° C. for 4 hours in a nitrogen atmosphere (see FIG. 8B).

After a buffer layer 809 and a resist mask 810 have been formed, boron is added to a region to become an NTFT. The boron adding method and conditions may be the same as in the first embodiment. A boron-containing region 811 is formed by this step (see FIG. 8C).

After the buffer layer 809 and the resist mask 810 have been removed, active layers 812 and 813 are formed by patterning. Thereafter, an excimer laser light is applied to repair damage caused by the boron addition, improve the crystallinity (for instance, crystallization of amorphous components that remain slightly), and activate boron atoms (see FIG. 8D).

In this embodiment laser light is applied after the crystalline silicon film 808 has been patterned into island-like, however, the crystalline silicon film 808 may be patterned into island-like active layers after irradiation with laser light.

By executing the ensuing steps in the same manner as in the first embodiment, the manufacture of a CMOS circuit having the structure shown in FIG. 2E is completed.

Embodiment 6

This embodiment is directed to a case of using a catalyst element (typically nickel) for accelerating crystallization in crystallizing an amorphous silicon film according to the second embodiment.

Figure 9A:
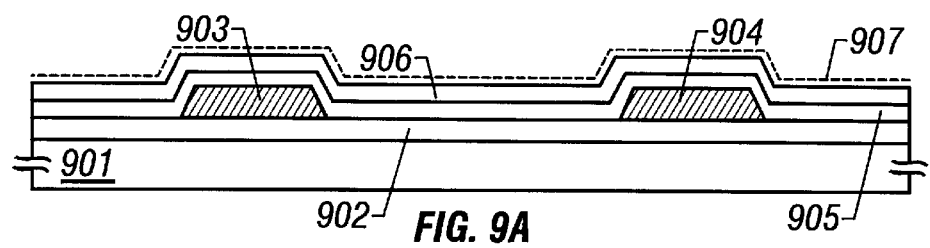
FIGS. 9A–9E show a manufacturing process of thin-film transistors according to a sixth embodiment of the invention.

In FIG. 9A, reference numeral 901 denotes a glass substrate; 902, an underlayer film; 903 and 904, n-type conductive polysilicon films as gate electrodes; 905, a gate insulating film; and 906, an amorphous silicon film. All the described in the second embodiment may be used for a gate electrode.

In this embodiment, a film 907 containing nickel (hereinafter referred to as a nickel-containing film) is formed on the amorphous silicon film 906 (see FIG. 9A). The nickel-containing film 907 may be formed by using a technique of the present inventors that is disclosed in Japanese Patent Laid-Open No. Hei 7-130652 (particularly the first embodiment).

Examples of the catalyst element other than nickel (Ni) are cobalt (Co), iron (Fe), palladium (Pd), platinum (Pt), copper (Cu), gold (Au), germanium (Ge), and lead (Pb).

Although the above publication describes an example of adding a catalyst element by spin coating, a catalyst element may be added by ion implantation or plasma doping. The latter techniques are effective in constructing a miniaturized circuit because they make it easier to reduce the area occupied by an catalyst element added region and to control the growth length of a lateral growth region.

Figure 9B:

After completion of the catalyst element adding step, hydrogen removal is performed at 500° C. for about 1 hour and then the amorphous silicon film 906 is crystallized by performing a heat treatment (furnace annealing) at 500° to 700° C. (typically 550° to 650° C.) for 4 to 24 hours in an inert atmosphere, a hydrogen atmosphere, or an oxygen atmosphere. In this embodiment, a crystalline silicon film 908 is obtained by performing a heat treatment at 550° C. for 4 hours in a nitrogen atmosphere (see FIG. 9B).

Figure 9C:
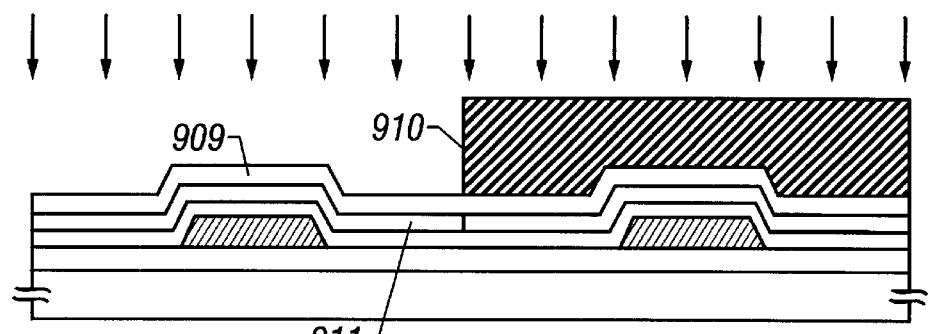

After a buffer layer 909 and a resist mask 910 have been formed, a Group 15 element (phosphorus in this embodiment) is added to only a region to become an NTFT. The boron adding method and conditions may be the same as in the second embodiment. A phosphorus-containing region 911 is formed by this step (see FIG. 9C).

Then, after the resist mask 910 has been removed, a resist mask 912 is formed again, and an element selected from Group 13 is added. In this embodiment, boron is added to form a boron-containing region 913. The boron adding method and conditions may be the same as in the second embodiment (see FIG. 9D).

After the buffer layer 909 and the resist mask 910 have been removed, active layers 914 and 915 are formed by patterning. Thereafter, an excimer laser light is applied to repair damage caused by the boron addition, improve the crystallinity (for instance, crystallization of amorphous components that remain slightly), and activate phosphorus and boron atoms (see FIG. 9E).

In this embodiment laser light is applied after the crystalline silicon film 908 has been patterned into island-like, however, the crystalline silicon film 908 may be patterned into island-like active layers after irradiation with laser light.

By executing the ensuing steps in the same manner as in the second embodiment, the manufacture of a CMOS circuit having the structure shown in FIG. 4E is completed.

Embodiment 7

This embodiment is directed to a case of crystallizing an amorphous silicon film by a different method than in the fifth embodiment, specifically by using a technique disclosed in Japanese Patent Laid-Open No. Hei 8-78329.

Figure 10A:
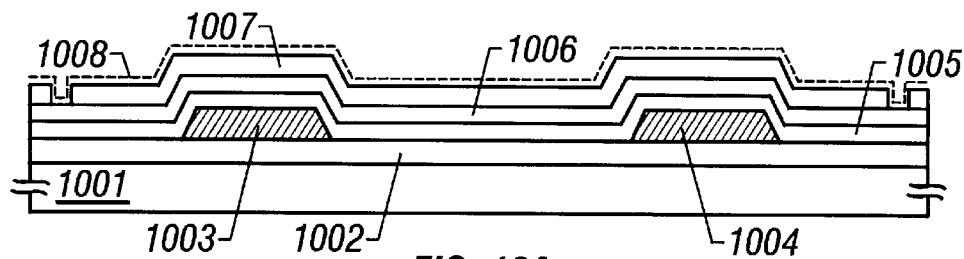
FIGS. 10A–10D show a manufacturing process of thin-film transistors according to a seventh embodiment of the invention.

In FIG. 10A, reference numeral 1001 denotes a glass substrate; 1002, an underlayer film; 1003 and 1004, gate electrodes; 1005, a gate insulating film; and 1006, an amorphous silicon film. The details of these components may be the same as in the first embodiment.

In this embodiment, a mask insulating film 1007 having a plurality of openings is formed on the amorphous silicon film 1006 and a nickel-containing layer 1008 is formed thereon. Therefore, the nickel-containing layer 1008 contacts the amorphous silicon film 1006 only in the openings of the mask insulating film 1007. The mask insulating film 1007 may be a silicon oxide film of 50 to 200 nm in thickness (see FIG. 10A).

After completion of the catalyst element adding step, hydrogen removal is performed at 450° C. for about 1 hour and then the amorphous silicon film 1006 is crystallized by performing a heat treatment at 500° to 700° C. (typically 550° to 650° C.) for 4 to 24 hours in an inert atmosphere, a hydrogen atmosphere, or an oxygen atmosphere. In this embodiment, a heat treatment is performed at 570° C. for 14 hours in a nitrogen atmosphere.

Figure 10B:
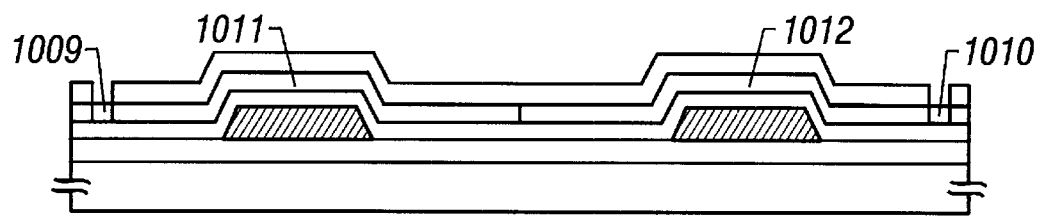

In this step, the crystallization of the amorphous silicon film 1006 proceeds, with priority, from nuclei that are generated in nickel-added regions 1009 and 1010, whereby crystal regions 1011 and 1012 are formed that have grown approximately parallel with the surface of the substrate 1001 (see FIG. 10B).

The inventors call the crystal regions 1011 and 1012 lateral growth regions. The lateral growth regions 1011 and 1012 has an advantage of superior overall crystallinity because they are a collection of rod-like or flat-rod-like crystals that are relatively uniform in crystallinity.

Figure 10C:
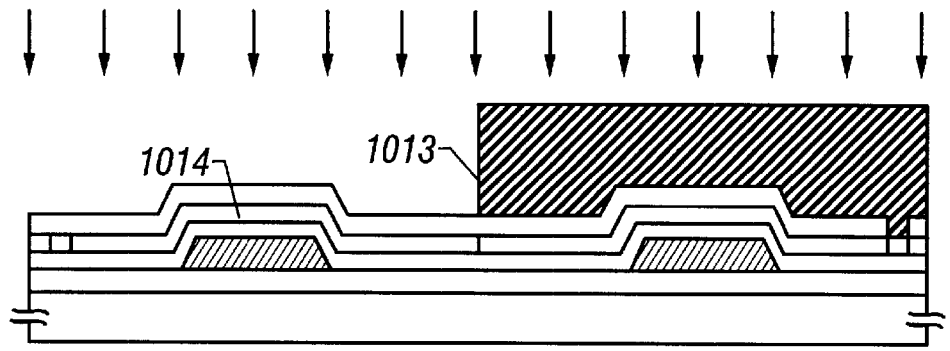
Figure 10D:
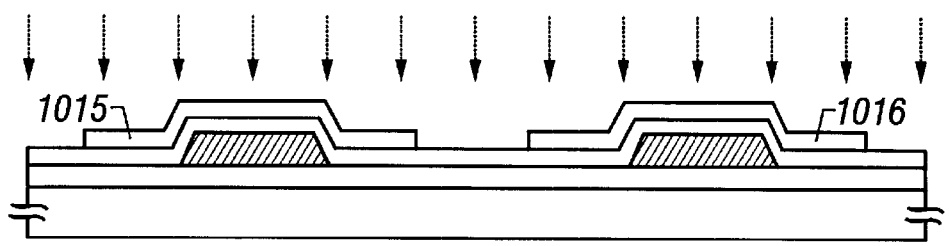

After the crystalline silicon films (lateral growth regions) 1011 and 1012 have been obtained in the above manner, a boron-containing region 1014 is formed by forming a resist mask 1013 and then executing a boron adding step (see FIG. 10C).

In this embodiment, the mask insulating film 1007 that was used in the catalyst element adding step is used as a buffer layer in the boron adding step, whereby the process can be simplified.

After the state of FIG. 10C has been obtained in the above manner, active layers 1015 and 1016 are formed that are parts of the lateral growth regions 1011 and 1012, respectively. It is preferable to completely remove the nickel-added regions 1009 and 1010 in forming the active layers 1015 and 1016.

Then, an excimer laser light is applied to repair damage of the active layers 1015 and 1016 caused by the boron addition, improve the crystallinity, and activate boron atoms. By executing the ensuing steps in the same manner as in the first embodiment, the manufacture of a CMOS circuit having the structure shown in FIG. 2E is completed.

Embodiment 8

This embodiment is directed to a case of crystallizing an amorphous silicon film by a different method than in the sixth embodiment, specifically by using a technique disclosed in Japanese Patent Laid-Open No. Hei 8-78329.

Figure 11A:
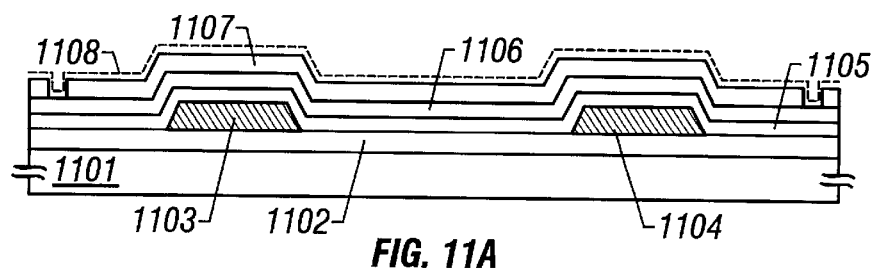
FIGS. 11A–11E show a manufacturing process of thin-film transistors according to an eighth embodiment of the invention.

In FIG. 11A, reference numeral 1101 denotes a glass substrate; 1102, an underlayer film; 1103 and 1104, chromium films as gate electrodes; 1105, a gate insulating film; and 1106, an amorphous silicon film. The details of these components may be the same as in the second embodiment.

In this embodiment, a mask insulating film 1107 having a plurality of openings is formed on the amorphous silicon film 1106 and a nickel-containing layer 1108 is formed thereon. Therefore, the nickel-containing layer 1108 contacts the amorphous silicon film 1106 only in the openings of the mask insulating film 1107. The mask insulating film 1107 may be a silicon oxide film of 50 to 200 nm in thickness (see FIG. 11A).

After completion of the catalyst element adding step, hydrogen removal is performed at 450° C. for about 1 hour and then the amorphous silicon film 1106 is crystallized by performing a heat treatment at 500° to 700° C. (typically 550° to 650° C.) for 4 to 24 hours in an inert atmosphere, a hydrogen atmosphere, or an oxygen atmosphere. In this embodiment, a heat treatment is performed at 570° C. for 14 hours in a nitrogen atmosphere.

Figure 11B:
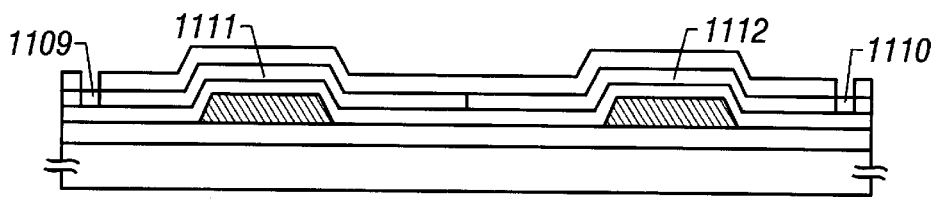

In this step, the crystallization of the amorphous silicon film 1106 proceeds, with priority, from nuclei that are generated in nickel-added regions 1109 and 1110, whereby crystal regions 1111 and 1112 are formed that have grown approximately parallel with the surface of the substrate 1101 (see FIG. 11B).

The inventors call the crystal regions 1111 and 1112 lateral growth regions. The lateral growth regions 1111 and 1112 have an advantage of superior overall crystallinity because they are a collection of rod-like or flat-rod-like crystals that are relatively uniform in crystallinity.

Figure 11C:
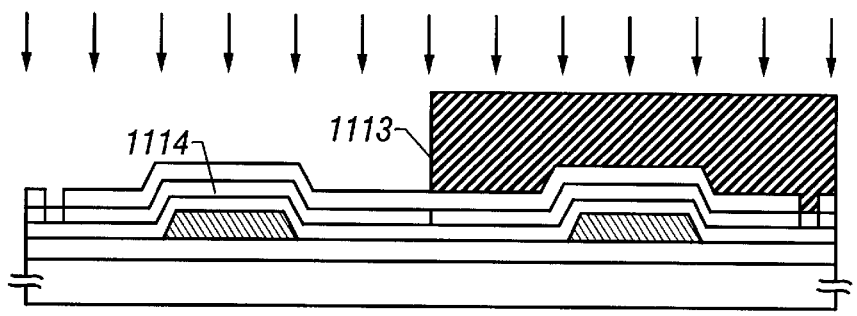

After the crystalline silicon films (lateral growth regions) 1111 and 1112 have been obtained in the above manner, a resist mask 1113 is formed, and then an element selected form Group 15 elements (in this embodiment, arsenic) is added so as to form an arsenic-containing region 1114 (see FIG. 11C).

After the resist mask 1113 has been removed, a resist mask 1115 is formed, and then an element selected form Group 13 elements (in this embodiment, indium) is added to a region to become a PTFT. As a result, an indium-containing region 1116 is formed (see FIG. 11D).

In this embodiment, the mask insulating film 1107 that was used in the catalyst element adding step is used as a buffer layer in the arsenic adding step, whereby the process can be simplified. The above-mentioned adding steps of arsenic and indium may be implemented under the condition of ion implantation described in the second embodiment.

Figure 11D:
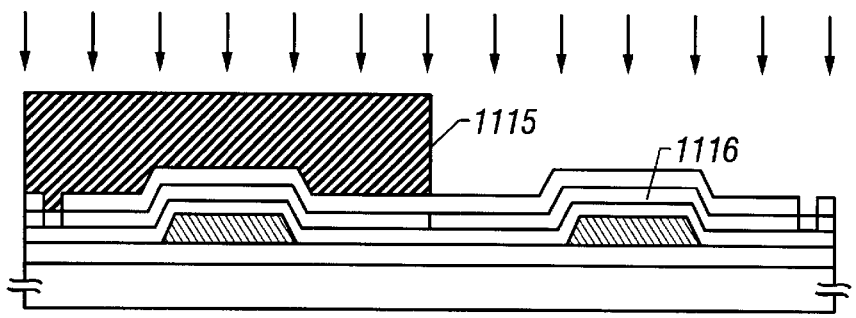
Figure 11E:
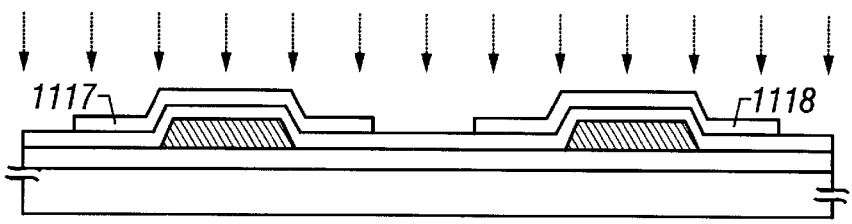

After the state of FIG. 11D has been obtained in the above manner, active layers 1117 and 1118 are formed that are parts of the lateral growth regions 1111 and 1112, respectively. It is preferable to completely remove the nickel-added regions 1109 and 1110 in forming the active layers 1117 and 1118.

Then, an excimer laser light is applied to repair damage of the active layers 1117 and 1118 caused by the ion implantation, improve the crystallinity, and activate arsenic and indium atoms. By executing the ensuing steps in the same manner as in the second embodiment, the manufacture of a CMOS circuit having the structure shown in FIG. 4E is completed.

Embodiment 9

This embodiment is directed to a case where a step of removing, by gettering, a catalyst element that has been used for crystallization is added to the process of the fifth embodiment. Specifically, a gettering effect of an element selected form Group 15 elements is used to getter a catalyst element (nickel). Examples of the element selected from Group 15 elements include P (phosphorus), N (nitrogen), As (arsenic), Sb (antimony), and Bi (bismuth). This embodiment uses phosphorus, which is a typical element for the intended gettering purpose.

Figure 8C:
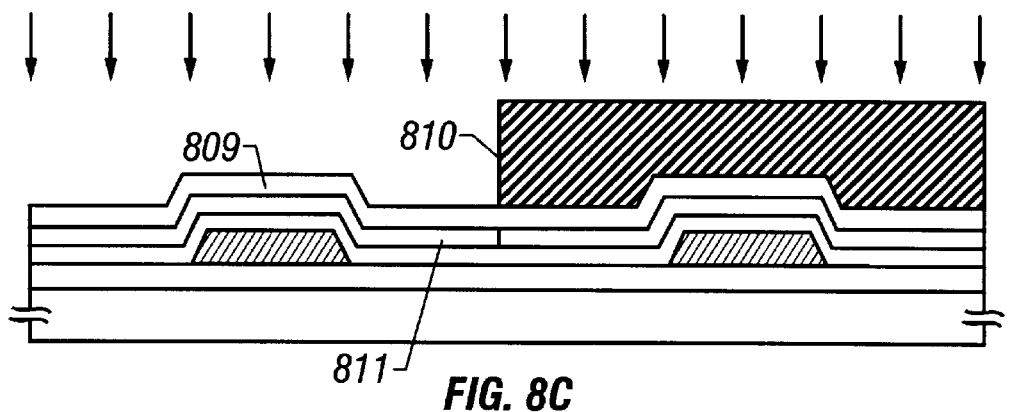
Figure 8D:
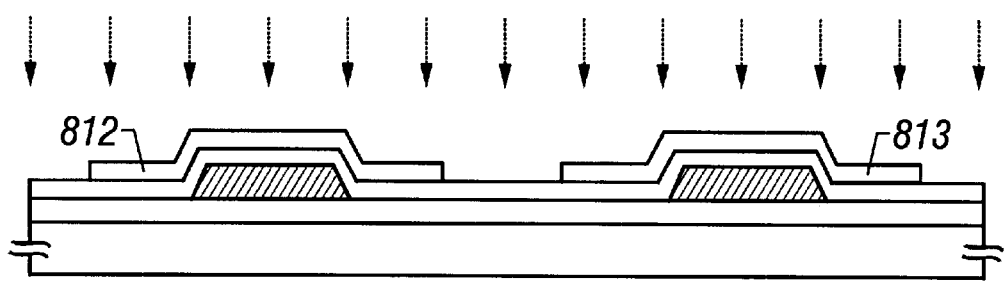
Figure 12A:
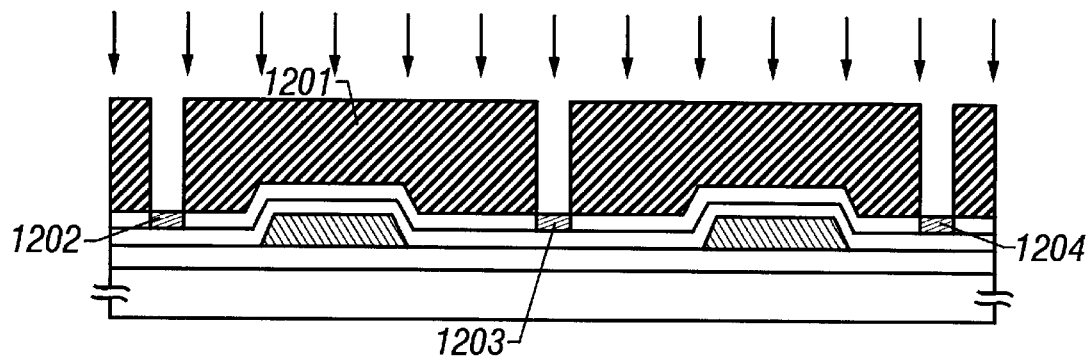
FIGS. 12A–12C show a manufacturing process of thin-film transistors according to a ninth embodiment of the invention.

First, the state of FIG. 8C is obtained according the process of the fifth embodiment. After the buffer layer 809 and the resist mask 810 have been removed, a resist mask 1201 having a plurality of openings is newly formed, as shown in FIG. 12A. The openings are formed at such positions as to expose regions that will not be used as part of an active layer (i.e., regions that will be removed).

Then, a step of adding phosphorus is executed by using the resist mask 1201 as a mask. Ion implantation or ion doping is used in this phosphorus adding step. As for the phosphorus adding conditions, the RF power is set to 20 W, the acceleration voltage is set to 5 to 30 keV (typically 10 keV), and the phosphorus does is set to $1 \times 10^{13}$ atoms/cm$^2$ or more (preferably $5 \times 10^{13}$ to $5 \times 10^{15}$ atoms/cm$^2$).

A rough criterion for determining the concentration of phosphorus atoms to be added may be such that it should be one order or more higher than the nickel concentration. Since nickel is contained in the crystalline silicon film 808 at about $1 \times 10^{19}$ atoms/cm$^3$ when the process of the third embodiment is executed, it is preferable to add phosphorus at about $1 \times 10^{20}$ atoms/cm$^3$.

Phosphorus-added regions (gettering regions) 1202 to 1204 are thus formed in the crystalline silicon film 808 (see FIG. 12A).

Figure 12B:
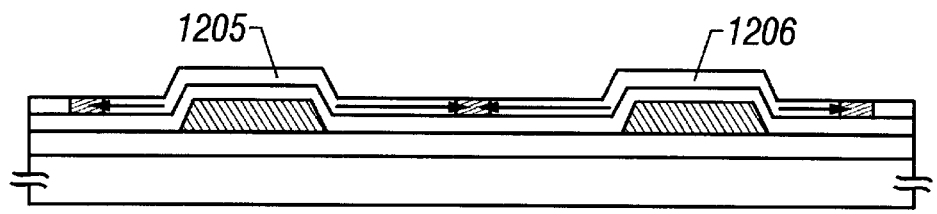

After the resist mask 1201 is removed, a heat treatment is performed to getter nickel atoms. As a result, nickel atoms contained in gettering subject regions 1205 and 1206 move to the gettering regions 1202 to 1204 and are captured there as shown by the arrow (see FIG. 12B).

This heating treatment may be furnace annealing in an inert atmosphere, a hydrogen atmosphere, an oxidizing atmosphere, or an oxidizing atmosphere containing a halogen element. The processing temperature and the processing time may be set to 400° to 700° C. (preferably 550° to 650° C.) and 2 hours or more (preferably 4 to 12 hours), respectively. Although as the processing temperature increases the processing time is shortened and the gettering effect is enhanced, in consideration of the heat resistance of the glass substrate, it is desirable that the processing temperature be set to 650° C. or less.

Boron has been added for the threshold voltage control in the gettering subject region 1205 to become part of an NTFT. Repairing of damage caused by the boron addition and activation of boron atoms are simultaneously effected by the furnace annealing. In the above-mentioned temperature range, the degree of diffusion of boron atoms is very low and the boron diffusion causes no problem.

After nickel atoms have been gettered in the gettering regions 1202 to 1204, the crystalline silicon film is patterned into active layers 1207 and 1208 that are part of the gettering subject regions 1205 and 1206, respectively. It is desirable to completely remove, that is, not to use as active layers, the gettering regions 1202 to 1204 and their vicinities because they contain nickel at a high concentration.

It has been confirmed by SIMS (secondary ion mass spectroscopy) that the nickel concentration of the active layers 1207 and 1208 that have been subjected to the gettering is reduced to $5 \times 10^{17}$ atoms/cm or less. (In this specification, the concentration is defined as a minimum value of SIMS measurement values.)

Because of the lower limit of detection, the only fact that is confirmed at present is that the nickel concentration is $5 \times 10^{17}$ atoms/cm$^3$ or less. However, the inventors think that actually the nickel concentration would be lower than about $1 \times 10^{14}$ atoms/cm$^3$. It has been confirmed experimentally that the presence of nickel does not affect the TFT characteristics as long as its concentration is $5 \times 10^{17}$ atoms/cm$^3$ or less.

Figure 12C:
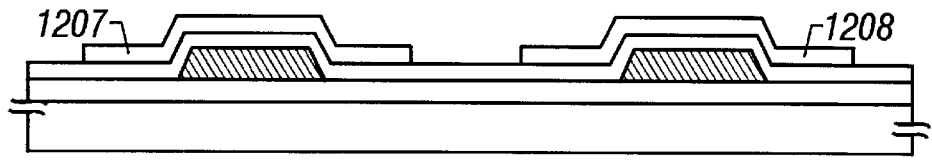

The state of FIG. 12C is thus obtained. By executing, as in the fifth embodiment, the ensuing steps in the same manner as in the first embodiment, the manufacture of a CMOS circuit having the structure shown in FIG. 2E is completed. In this embodiment, the crystallization method of the seventh embodiment may be used rather than that of the fifth embodiment. In such a case, the mask insulating film 1007 that was used for the nickel addition can also be used as a mask for not only the boron addition but also the phosphorus addition in this embodiment. This greatly simplifies the process.

Although this embodiment is directed to the case where phosphorus is added by ion implantation or ion doping, annealing may be performed in an atmosphere containing phosphorus (vapor-phase method) or a catalyst element may be moved to an insulating film containing phosphorus and gettered there (solid-phase method).

Embodiment 10

This embodiment is directed to a case where a step of removing, by gettering, a catalyst element that has been used for crystallization is added to the process of the sixth embodiment. Specifically, a gettering effect of an element selected form Group 15 elements is used to getter a catalyst element (nickel). Examples of the element selected from Group 15 elements include P (phosphorus), N (nitrogen), As (arsenic), Sb (antimony), and Bi (bismuth). This embodiment uses phosphorus, which is a typical element for the intended gettering purpose.

Figure 9D:
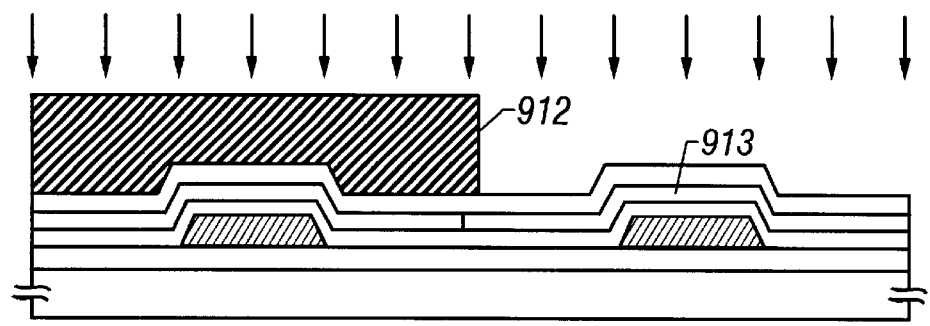
Figure 9E:
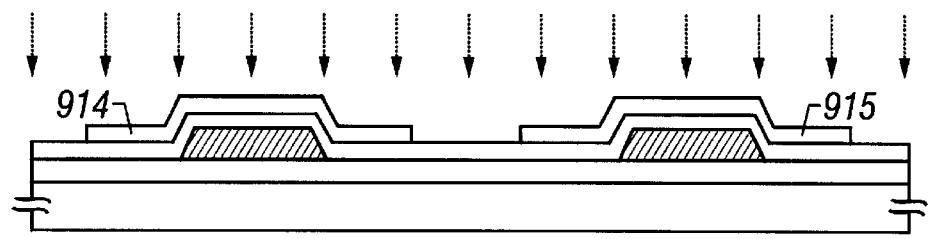
Figure 13A:
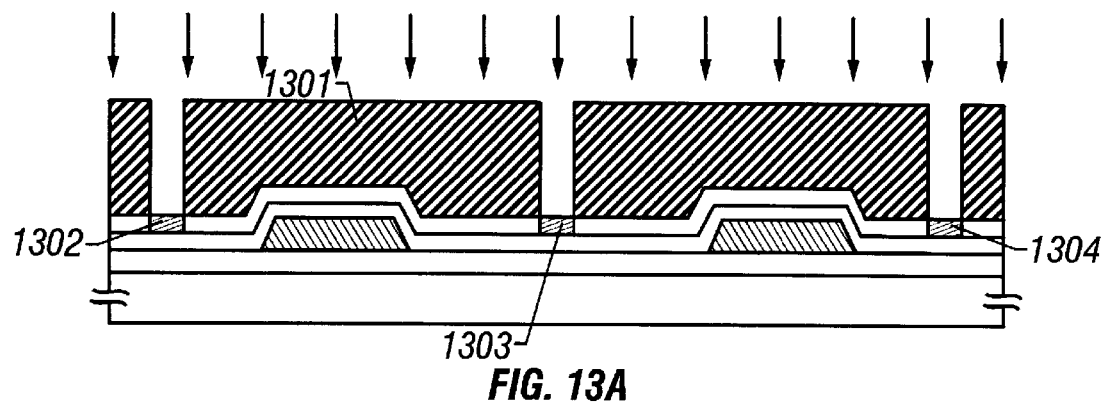
FIGS. 13A–13C show a manufacturing process of thin-film transistors according to a tenth embodiment of the invention.

First, the state of FIG. 9D is obtained according the process of the sixth embodiment. After the buffer layer 909 and the resist mask 912 have been removed, a resist mask 1301 having a plurality of openings is newly formed, as shown in FIG. 13A. The openings are formed at such positions as to expose regions that will not be used as part of an active layer (regions to be removed).

Then, a step of adding phosphorus is executed by using the resist mask 1301 as a mask. Ion implantation or ion doping is used in this phosphorus adding step. As for the phosphorus adding conditions, the RF power is set to 20 W, the acceleration voltage is set to 5 to 30 keV (typically 10 keV), and the phosphorus does is set to $1 \times 10^{13}$ atoms/cm$^2$ or more (preferably $5 \times 10^{13}$ to $5 \times 10^{15}$ atoms/cm$^2$).

A rough criterion for determining the concentration of phosphorus atoms to be added may be such that it should be one order or more higher than the nickel concentration in the crystalline silicon film 908. Since nickel is contained in the crystalline silicon film 908 at about $1 \times 10^{19}$ atoms/cm$^3$ when the process of the sixth embodiment is executed, it is preferable to add phosphorus at about $1 \times 10^{20}$ atoms/cm$^3$.

Phosphorus-added regions (gettering regions) 1302 to 1304 are thus formed in a part of the crystalline silicon film 908 (see FIG. 13A).

Figure 13B:
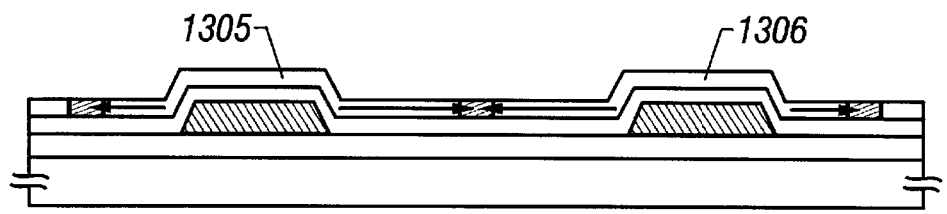

After the resist mask 1301 is removed, a heat treatment is performed to getter nickel atoms. As a result, nickel atoms contained in gettering subject regions 1305 and 1306 move to the gettering regions 1302 to 1304 and are captured there as shown by the arrow (see FIG. 13B).

This heating treatment may be furnace annealing in an inert atmosphere, a hydrogen atmosphere, an oxidizing atmosphere, or an oxidizing atmosphere containing a halogen element. The processing temperature and the processing time may be set to 400° to 700° C. (preferably 550° to 650° C.) and 2 hours or more (preferably 4 to 12 hours), respectively. As the processing temperature increases, the processing time is shortened, and the gettering effect is enhanced, however, in consideration of the heat resistance of the glass substrate, it is desirable that the processing temperature be set to 650° C. or less.

Phosphorus has been added in the gettering subject region 1305 to become part of he NTFT, and boron has been added in the gettering region 1306 to become part of the PTFT. Repairing of damage caused by the impurity addition and activation of impurity atoms are simultaneously effected by the furnace annealing. In the above-mentioned temperature range, the degrees of diffusion of boron and phosphorus atoms are very low, and the boron and diffusion of phosphorus diffusion cause no problem.

After nickel atoms have been gettered in the gettering regions 1302 to 1304, the crystalline silicon film 908 is patterned into active layers 1307 and 1308 that are part of the gettering subject regions 1305 and 1306, respectively. It is desirable to completely remove, that is, not to use as active layers, the gettering regions 1302 to 1304 and their vicinities because they contain nickel at a high concentration.

It has been confirmed by SIMS (secondary ion mass spectroscopy) that the nickel concentration of the active layers 1307 and 1308 that have been subjected to the gettering is reduced to $5 \times 10^{17}$ atoms/cm$^3$ or less (In this specification, the concentration is defined as a minimum value of SIMS measurement values).

Because of the lower limit of detection, the only fact that is confirmed at present is that the nickel concentration is $5 \times 10^{17}$ atoms/cm$^3$ or less. However, the inventors think that actually the nickel concentration would be lower than about $1 \times 10^{14}$ atoms/cm$^3$. It has been confirmed experimentally that the presence of nickel does not affect the TFT characteristics as long as its concentration is $5 \times 10^{17}$ atoms/cm$^3$ or less.

Figure 13C:
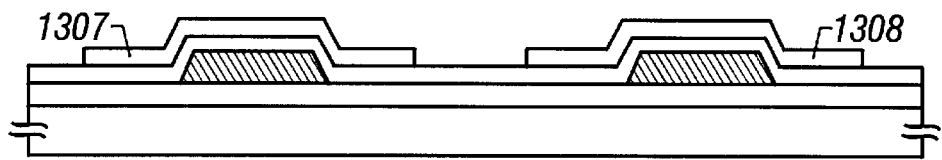

The state of FIG. 13C is thus obtained. By executing, as in the sixth embodiment, the ensuing steps in the same manner as in the second embodiment, the manufacture of a CMOS circuit having the structure shown in FIG. 4E is completed.

In this embodiment, the crystallization method of the eighth embodiment may be used rather than that of the sixth embodiment. In such a case, the mask insulating film 1107 that was used for the nickel addition can also be used as a mask for not only the boron addition but also the phosphorus addition in this embodiment. This greatly simplifies the process.

Although this embodiment is directed to the case where phosphorus is added by ion implantation or ion doping, annealing may be performed in an atmosphere containing phosphorus (vapor-phase method) or a catalyst element may be moved to an insulating film containing phosphorus and gettered there (solid-phase method)

In this embodiment, phosphorus has already been added to a region to become part of the NTFT (the gettering subject region 1305) for the purpose of controlling the threshold voltage. Therefore, a catalyst element may be captured by phosphorus in the gettering subject region 1305.

However, in this embodiment, the concentration of phosphorus added to the gettering region 1302 to 1304 is one order or more higher than the concentration of phosphorus added to the gettering subject region 1305. Therefore, gettering ability is much higher in the gettering region 1302 to 1304, whereby gettering is performed without problems.

Further, in a case of performing gettering by phosphorus as in this embodiment, preferably arsenic or antimony which has lower gettering ability than phosphorus has is used as a Group 15 element to be added (an element for threshold voltage control) to a region to become part of the NTFT.

Embodiment 11

Figure 14A:
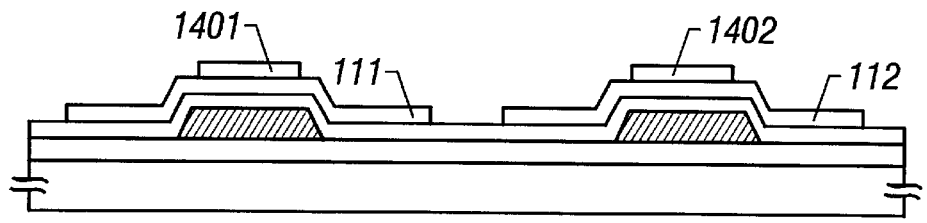
FIGS. 14A–14C show a manufacturing process of thin-film transistors according to a eleventh embodiment of the invention.

This embodiment is directed to a case of manufacturing an inverted staggered structure TFT having a different structure shown in the first embodiment. This embodiment will be described with reference to FIGS. 14A–14C.

Figure 1D:
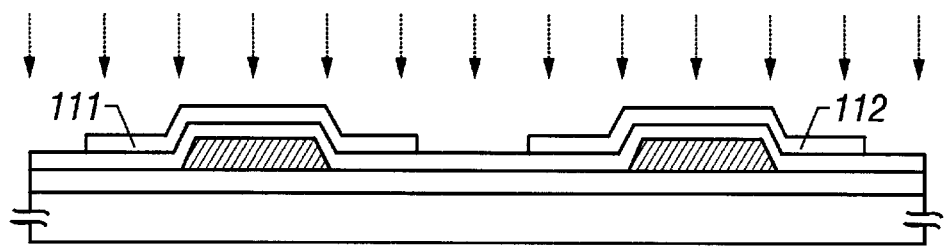

First, the state of FIG. 1D is obtained according to the process of the first embodiment. Then, channel stoppers 1401 and 1402 are formed on the active layers 111 and 112, respectively (see FIG. 14A). The channel stoppers 1401 and 1402 may be a silicon nitride film or a silicon oxide film of 30 to 150 nm in thickness.

Figure 14B:
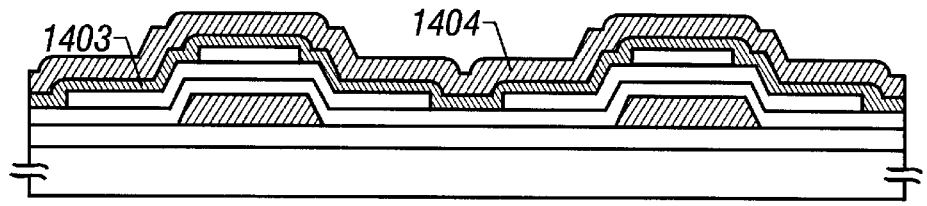

Then, a crystalline silicon film 1403 having n-type conductivity (hereinafter abbreviated as an n-type conductive film) is formed and a metal thin film 1404 is formed thereon (see FIG. 14B). The n-type conductive film 1403 may be a phosphorus-added polycrystalline or microcrystalline silicon film. The metal thin film 1404 may be the same as the metal thin film that constitutes the source and drain electrodes in the first embodiment.

It is preferable to form the n-type conductive film 1403 and the metal thin film 1404 continuously because a very good ohmic contact is obtained.

Then, the metal thin film 1404 is etched to divide it at desired positions. Thereafter, the n-type conductive film 1403 is etched in a self-aligned manner by using the metal thin film 1404 as a mask. In this step, the channel stoppers 1401 and 1402 serve as etching stoppers.

Figure 14C:
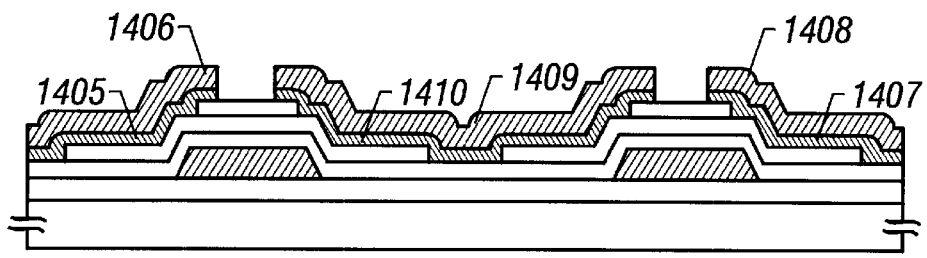

In this manner, source electrodes 1405 and 1406 of an NTFT, source electrodes 1407 and 1408 of a PTFT, and common drain electrodes 1409 and 1410 of the NTFT and PTFT are formed. A silicon nitride film or an organic resin film as a passivation film may be formed on those electrodes. A CMOS circuit having a structure of FIG. 14C is thus completed.

The types of inverted staggered structure TFTs using channel stoppers are not limited to the one described in this embodiment. The invention can also be applied easily to other types of inverted staggered structure TFTs.

Embodiment 12

This embodiment is directed to a case of manufacturing an inverted staggered structure TFT having a different structure shown in the first and eleventh embodiments. This embodiment will be described with reference to FIGS. 15A and 15B.

First, the state of FIG. 1D is obtained according to the process of the first embodiment. Then, an n-type conductive film 1501 is formed on the active layers 111 and 112 and a metal thin film 1502 is formed thereon (see FIG. 15A). Since the details of those thin films were described in the eleventh embodiment, a description therefor is omitted here.

Then, the metal thin film 1502 is etched to divide it at desired positions. Thereafter, the n-type conductive film 1501 is etched in a self-aligned manner. In this step, the etching proceeds to the insides of the active layers 111 and 112 because the selective ratio of the n-type conductive film 1501 to the underlying active layers 111 and 112 is not sufficiently large.

Therefore, the etched portions of the active layers 111 and 112 are thinner than the other portions. The thinned portions will serve as effective channel forming regions.

In this manner, source electrodes 1503 and 1504 of an NTFT, source electrodes 1505 and 1506 of a PTFT, and common drain electrodes 1507 and 1508 of the NTFT and PTFT are formed. Finally, a silicon nitride film 1509 as a passivation film is formed, to complete a CMOS circuit having a structure of FIG. 15B.

Where peripheral driver circuits and a pixel matrix circuit are formed on the same substrate as in the case of, for instance, active matrix liquid crystal display devices, there may occur a case that an organic resin film is formed instead of the silicon nitride film 1509. In such a case, the organic resin film serves as a passivation film. This also applies to the eleventh embodiment.

Figure 15A:
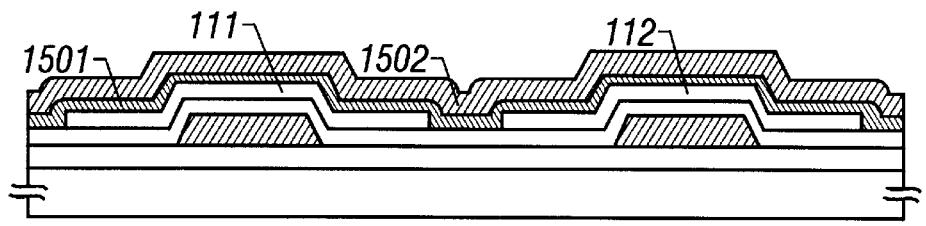
FIGS. 15A and 15B show a manufacturing process of thin-film transistors according to a twelfth embodiment of the invention.
Figure 15B:
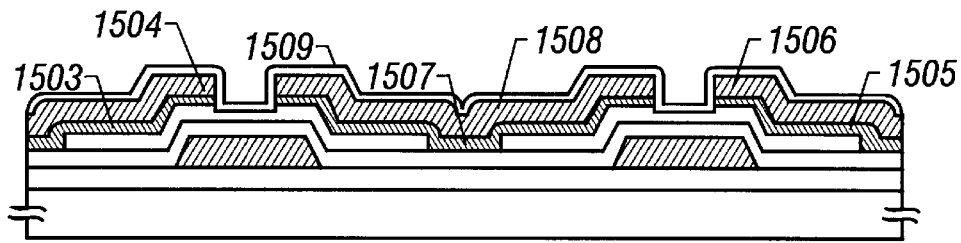

In the structure of this embodiment, in the state of FIG. 15A the n-type conductive film 1501 is in contact with regions that will become channel-forming regions. This may cause a problem that boron atoms added to the active layer 111 and phosphorus atoms in the n-type conductive film 1501 cancel out each other through mutual diffusion and the channel forming region thereby is rendered substantially intrinsic or inverted to an n-type, in which case a desired threshold voltage is not obtained.

This problem can be avoided by adding, in the channel doping step (i.e., the step of adding boron to control the threshold voltage), boron at a higher concentration than the phosphorus concentration contained in the n-type conductive film 1501. With this measure, even if boron atoms and phosphorus atoms cancel out each other, the p-type conductivity can be maintained because the absolute amount of boron atoms is large. Naturally, it is necessary to perform channel doping so as to obtain a desired threshold voltage, in consideration of a concentration of boron atoms that will finally remain.

The invention can easily be applied to inverted staggered structure TFTs having different structures than in this embodiment.

Embodiment 13

Figure 16A:
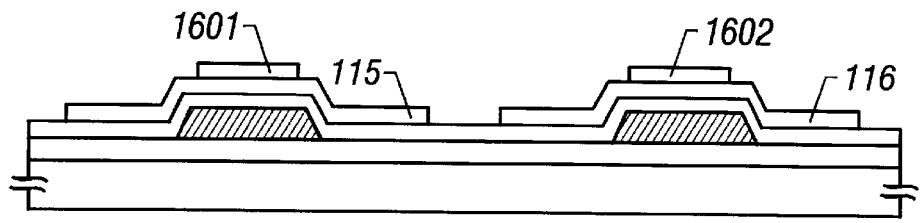
FIGS. 16A–16C show a manufacturing process of thin-film transistors according to a thirteenth embodiment of the invention.

This embodiment is directed to a case of manufacturing an inverted staggered structure TFT having a different structure shown in the second embodiment. This embodiment will be described with reference to FIGS. 16A–16C.

First, the state of FIG. 3D is obtained according to the process of the second embodiment. Then, channel stoppers 1601 and 1602 are formed on the active layers 215 and 216, respectively (see FIG. 16A). The channel stoppers 1601 and 1602 may be a silicon nitride film or a silicon oxide film of 30 to 150 nm in thickness.

Figure 16B:
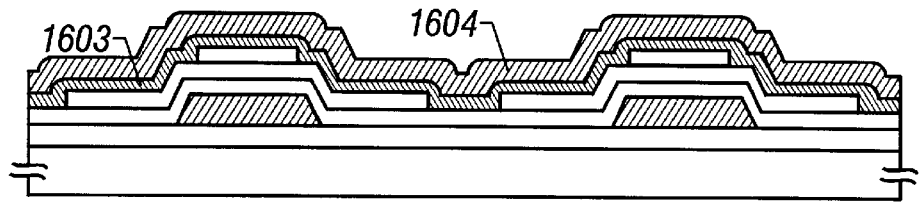

Then, a crystalline silicon film 1603 having n-type conductivity (hereinafter abbreviated as an n-type conductive film) is formed and a metal thin film 1604 is formed thereon (see FIG. 16B). The n-type conductive film 1603 may be a phosphorus-added polycrystalline or microcrystalline silicon film. The metal thin film 1604 may be the same as the metal thin film that constitutes the source and drain electrodes in the first embodiment.

It is preferable to form the n-type conductive film 1603 and the metal thin film 1604 continuously because a very good ohmic contact is obtained.

Then, the metal thin film 1604 is etched to divide it at desired positions. Thereafter, the n-type conductive film 1603 is etched in a self-aligned manner by using the metal thin film 1604 as a mask. In this step, the channel stoppers 1601 and 1602 serve as etching stoppers.

Figure 16C:
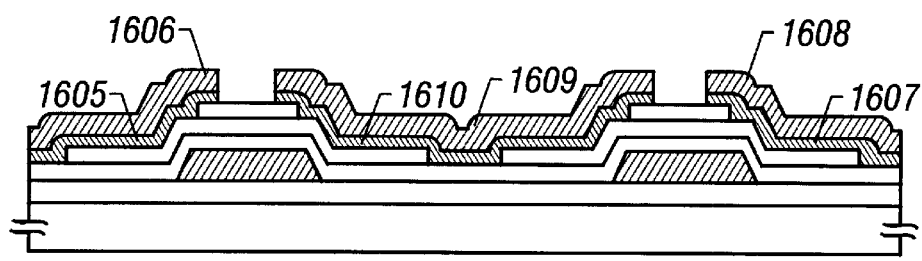

In this manner, source electrodes 1605 and 1606 of an NTFT, source electrodes 1607 and 1608 of a PTFT, and common drain electrodes 1609 and 1610 of the NTFT and PTFT are formed. A silicon nitride film or an organic resin film as a passivation film may be formed on those electrodes. A CMOS circuit having a structure of FIG. 16C is thus completed.

The types of inverted staggered structure TFTs using channel stoppers are not limited to the one described in this embodiment. The invention can also be applied easily to other types of inverted staggered structure TFTs.

Further, inverted staggered structure TFTs in this embodiment can be arranged by suitably combining arrangements described in the first to eleventh embodiments.

Embodiment 14

This embodiment is directed to a case of manufacturing an inverted staggered structure TFT having a different structure shown in the second and twelfth embodiments. This embodiment will be described with reference to FIGS. 17A and 17B.

First, the state of FIG. 3D is obtained according to the process of the second embodiment. Then, an n-type conductive film 1701 is formed on the active layers 215 and 216 and a metal thin film 1702 is formed thereon (see FIG. 17A). Since the details of those thin films were described in the thirteenth embodiment, a description therefor is omitted here.

Then, the metal thin film 1702 is etched to divide it at desired positions. Thereafter, the n-type conductive film 1701 is etched in a self-aligned manner. In this step, the etching proceeds to the insides of the active layers 211 and 212 because the selective ratio of the n-type conductive film 1701 to the underlying active layers 211 and 212 is not sufficiently large.

Therefore, the etched portions of the active layers 211 and 212 are thinner than the other portions. The thinned portions will serve as effective channel forming regions.

In this manner, source electrodes 1703 and 1704 of an NTFT, source electrodes 1705 and 1706 of a PTFT, and common drain electrodes 1707 and 1708 of the NTFT and PTFT are formed. Finally, a silicon nitride film 1709 as a passivation film is formed, to complete a CMOS circuit having a structure of FIG. 7C.

Where peripheral driver circuits and a pixel matrix circuit are formed on the same substrate as in the case of, for instance, active matrix liquid crystal display devices, there may occur a case that an organic resin film is formed instead of the silicon nitride film 1709. In such a case, the organic resin film serves as a passivation film. This also applies to the twelfth embodiment.

Figure 17A:
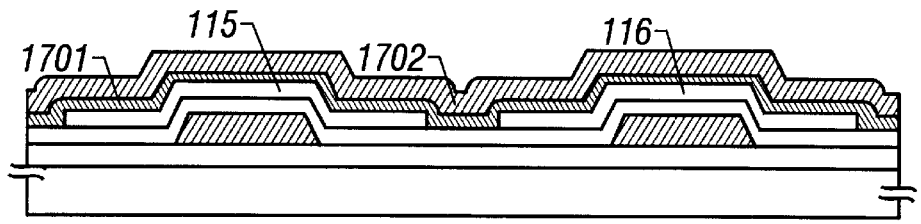
FIGS. 17A and 17B show a manufacturing process of thin-film transistors according to a fourteenth embodiment of the invention.
Figure 17B:
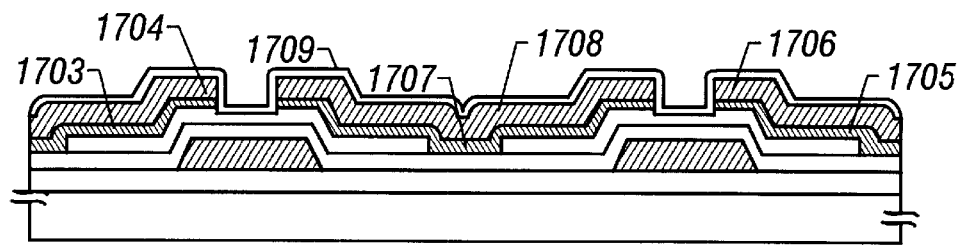

In the structure of this embodiment, in the state of FIG. 17A the n-type conductive film 1701 is in contact with regions that will become channel forming regions. This may cause a problem that boron atoms added to the active layer 216 (on a PTFT side) and phosphorus atoms in the n-type conductive film 1701 cancel out each other through mutual diffusion and the channel forming region thereby is rendered substantially intrinsic or inverted to an n-type, in which case a desired threshold voltage is not obtained.

This problem can be avoided by adding, in the channel doping step, boron at a higher concentration than the phosphorus concentration contained in the n-type conductive film 1701. With this measure, even if boron atoms and phosphorus atoms cancel out each other, the p-type conductivity can be maintained because the absolute amount of boron atoms is large. Naturally, it is necessary to perform channel doping so as to obtain a desired threshold voltage, in consideration of a concentration of boron atoms that will finally remain.

The invention can easily be applied to inverted staggered structure TFTs having different structures shown in this embodiment.

Further, inverted staggered structure TFTs in this embodiment can be arranged by suitably combining arrangements described in the first to fourteenth embodiments.

Embodiment 15

Although the first to fourteenth embodiments are directed to the case of using the buffer layer in the channel doping step, the buffer layer can be omitted by optimizing the impurity (e.g., boron) adding conditions. In this case, although the silicon film is damaged more heavily by the boron addition, the damage causes no problem if it is in such a degree as to be repaired by the later furnace annealing or laser annealing.

Embodiment 16

While in the first to fourteenth embodiments a Group 13 element is used to shift the threshold voltage to the plus side, if it is necessary to shift the threshold voltage to the minus side, an element selected form Group 15 elements (phosphorus, arsenic, or antimony) may be used as an impurity element for the channel doping.

Since the concentration profile of phosphorus ions added by ion implantation is different from that of boron, it is necessary to experimentally determine, in advance, optimum values of various conditions such as the dose.

Where this embodiment is combined with the gettering by phosphorus in the fifth embodiment, in this embodiment phosphorus atoms also go into the channel forming region and hence a marked gettering effect is not expected.

Embodiment 17

The first to fourteenth embodiments are directed to the case where after the channel doping step the impurity is activated by irradiation with excimer laser light. In the invention, lamp annealing as typified by RTA (rapid thermal annealing) may be used instead of the laser annealing.

The RTA is performed at 500° to 1,150° C. (preferably 800° to 1,000° C. for only several seconds, and the thin film can be annealed without deforming the glass substrate. Therefore, the throughput can be increased greatly.

The impurity may be activated by furnace annealing of about 500° to 600° C., however, the RTA is effective in increasing the productivity.

Embodiment 18

This embodiment is directed to the case of manufacturing an electro-optical device by forming circuits on a glass substrate by using the semiconductor devices having the structure according to any of the first to seventeenth embodiments. Typically, a liquid crystal display device, an EL (electroluminescence) display device, an EC (electrochromic) display device, an image sensor, and a CCD can be manufactured.

In this specification, the electro-optical device is defined as a device for converting an electrical signal into an optical signal or vice versa.

Figure 18A:
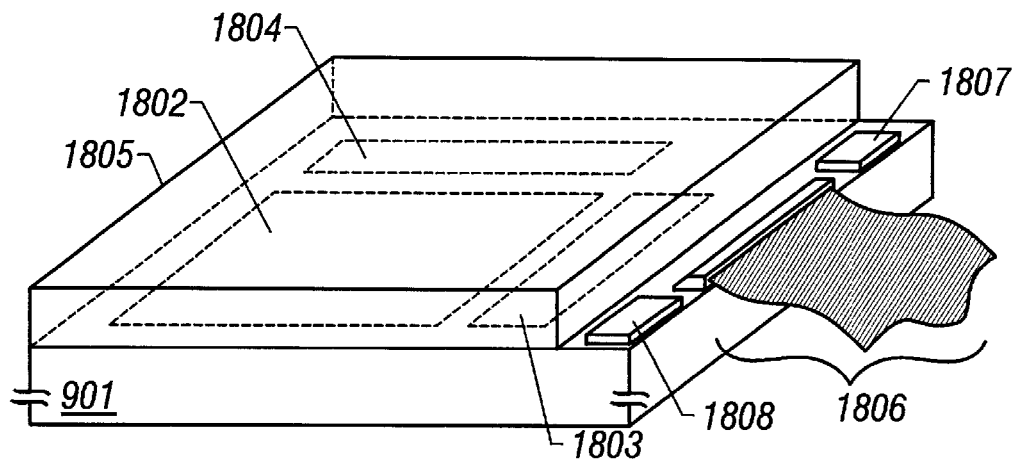
FIGS. 18A and 18B show a manufacturing process of thin-film transistors according to a eighteenth embodiment of the invention.

FIG. 18A shows a liquid crystal display device (liquid crystal module). An active matrix substrate 1801 is configured in such a manner that a pixel matrix circuit 1802, a source-side driver circuit 1803, and a gate-side driver circuit 1804 each of which is constituted of TFTs according to the invention are formed on a glass substrate.

The source-side driver circuit 1803 is mainly composed of a shift register circuit, a sampling circuit, a buffer circuit, a level shifter circuit and the like. The gate-side driver circuit 1804 is mainly composed of a shift register circuit, a buffer circuit and the like.

A liquid crystal layer (not shown) is sealed by a sealing material between the active matrix substrate 1801 having the above configuration and an opposed substrate 1806. The active matrix substrate 1801 and the opposed substrate 1806 are bonded to each other so that the corresponding end faces are flush with each other at all sides excluding one side where the opposed substrate 1806 is partially removed to expose part of the active matrix substrate 1801.

Terminals for transmitting external signals to the source-side and gate-side driver circuits 1803 and 1804 are exposed in the above region, and this region serves for connection to a FPC (flexible print circuit) 1807.

Further, IC chips 1808 and 1809 can be mounted by effectively using region where the FPC 1807 is mounted. Two chips are mounted in this embodiment, however, an arrangement with one or plurality of (two or more) chips may be possible. An arrangement according to this embodiment is effective for minimizing the size of the liquid crystal module.

The IC chip constitutes a logic circuit including various types of signal processing circuits such as an information processing of a video signal including image information and a clock pulse generating/controlling circuit, which are required for image display. In this embodiment, each circuit is made up of a MOSFET formed on a single crystal chip and mounted on a substrate as an IC chip.

In this embodiment, an example in which the IC chips 1807 and 1808 are mounted by face-down method is described, however, face-up method (wire-bonding method) may be used.

Figure 18B:
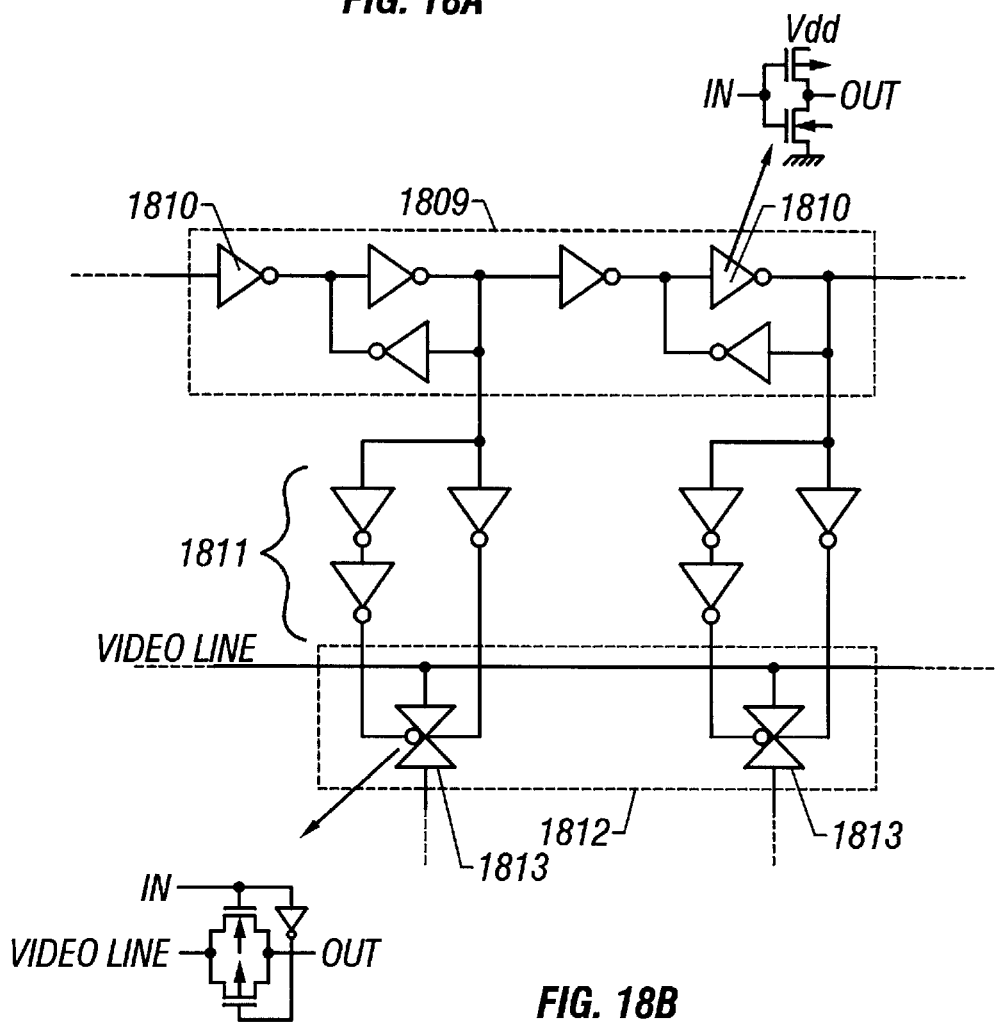

FIG. 18B is a simplified circuit diagram of the source-side driver circuit 1803. In a shift register circuit 1809, a flip-flop circuit is composed of a plurality of inverter circuits (CMOS circuits) 1810. An equivalent circuit of the flip-flop circuit 1810 is indicated by an arrow.

Also, with a buffer circuit 1811 between, a sampling circuit 1812 is composed of a plurality of analog switches 1813. An equivalent circuit of the sampling circuit is indicated by an arrow.

According to the invention, since the threshold voltages of the respective TFTs have been adjusted to have proper values by the channel doping, the TFTs can easily accommodate a low operating voltage. Further, since in the channel portion carriers are scattered by impurities at a very low possibility, high mobility can be obtained even though the threshold voltage is controlled.

Therefore, the TFTs of the invention is effective in the shift register circuit 1809. that are required to have a low operating voltage and a high operation speed.

Further, since the characteristics balance between the NTFT and the PTFT that constitute the CMOS circuit have been corrected by the threshold voltage control, the CMOS circuit is suitable for constructing such a circuit as the analog switch 1811 in which balancing the characteristics of the NTFT and PTFT is important.

An example of the system configuration of the liquid crystal module shown in this embodiment will be described with reference to block diagrams shown in FIGS. 19 and 20. It goes without saying that system configurations other than the embodiment of the present invention would be applicable.

Figure 19:
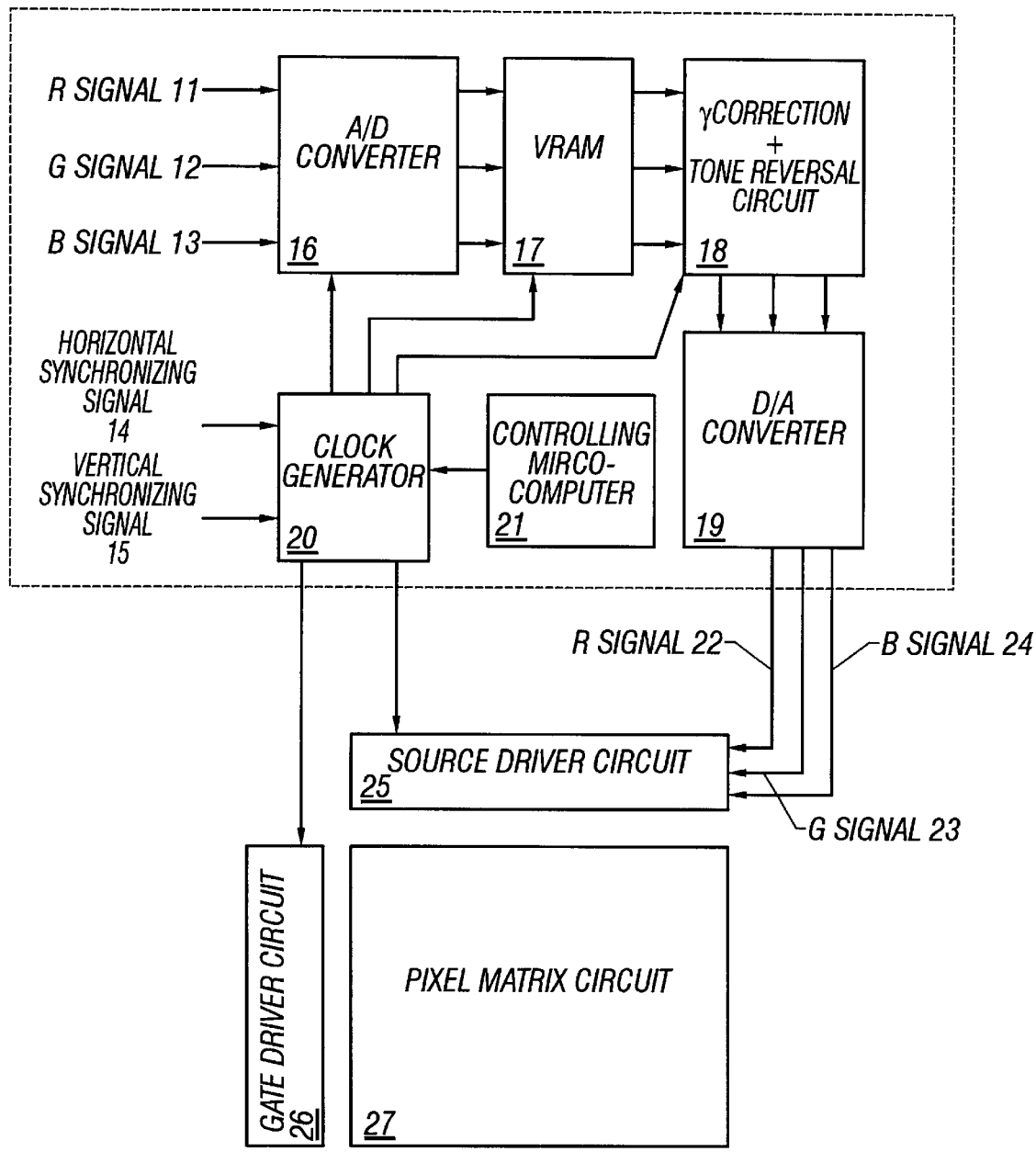
FIGS. 19 and 20 show the configuration of an electro-optical device according to an eighteenth embodiment of the invention.

Referring now to FIG. 19, an area that is indicated by a dotted line is an IC chip portion. The analog signals transferred externally are an R signal 11, a G signal 12, a B signal 13, and a horizontal synchronizing signal 14 and a vertical synchronizing signal 15. The RGB signals 11 to 13 are outputted by an analog signal through an A/D converter 16, a VRAM 17 by which the time base is extended, a γ correction+tone reversal circuit 18 and a D/A converter 19.

In the meantime, a clock pulse or a start pulse is formed in a clock generator 20 so as to correspond to XGA, SXGA, etc. on the basis of the horizontal synchronizing signal 14 and the vertical synchronizing signal 15 to be transferred to the AID converter 16, the VRAM 17, the γ correction+tone reversal circuit 18 and the like. The clock generator 20 is controlled by a controlling microcomputer 21.

Thus, the R signal 22, the G signal 23 and the B signal 24 are outputted as the analog signals that terminate its necessary processing. A source driver circuit 25, a gate driver circuit 26 and a pixel matrix circuit 27 are formed on a liquid crystal panel by the TFTs according to the present invention to transfer to the source driver circuit 25, the R signal 22, the G signal 23, and the B signal 24 as described above.

Figure 20:
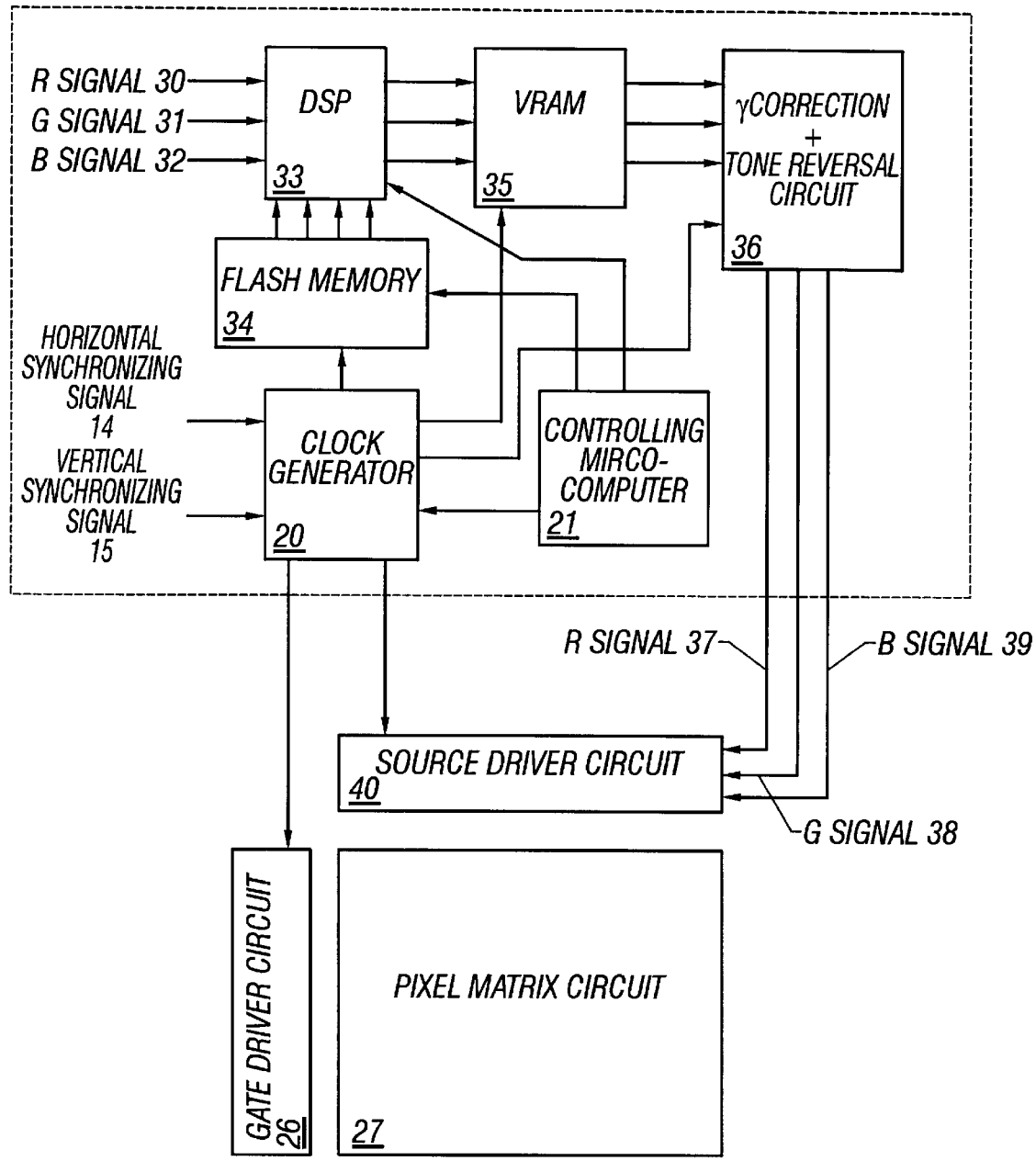

FIG. 20 exemplifies the case where a digital signal is processed. First, a correction processing is performed for the digitized RGB signals 30 to 32 at a DSP (Digital Signal Processor) 33. In the meanwhile, correction data that is stored in a flash memory 34 is read out at any time.

Next, the video signal under the correction processing is processed at the VRAM 35 and the γ correction+tone reversal circuit 36 to be transferred to the source driver circuit 40 serving as the R signal 37, the G signal 38 and the B signal 39. The source driver circuit 40 has a slight different configuration from that of the source driver circuit 25 as shown in FIG. 10, but both the basic operations are the same. A detailed circuitry may be conveniently designed by a user so as to become the optimal circuit.

As described above, in the liquid crystal module according to this embodiment, a pixel matrix circuit and a driver circuit are formed on the glass substrate using a bottom gate type TFT in accordance with the present invention. Further, other signal processing circuits are externally attached thereto with an IC. That is, a feature of the present invention resides in that while the pixel matrix circuit and the driver circuit are formed integrally on the substrate at minimum cost, only a logic circuit difficult to be produced by TFTs in view of its operational performance is made up with the IC chip that has been manufactured by a conventional IC technique.

Such a configuration may allow the liquid crystal module having an extremely high functionality to be produced at low manufacturing cost. It goes without saying that the future improvement of the operational performance of the TFTs would also enable the logic circuit to be formed integrally by the TFTs formed on the glass substrate. In such a case, the present invention will be highly effectively applicable to the TFTs that constitute the logic circuit.

Embodiment 19

The electro-optical device of the eighteenth embodiment is used as a display of various electronic apparatuses. In this specification, the electronic apparatus is defined as a product having an electro-optical device as typified by a liquid crystal module.

Examples of the electronic apparatus include a video camera, a still camera, a projector, a projection TV, a head-mounted display, a car navigation apparatus, a personal computer (including a notebook-sized one), and portable information terminals (a mobile computer, a cellular telephone, etc.). Part of those examples are shown in FIGS. 21A to 21F.

Figure 21A:
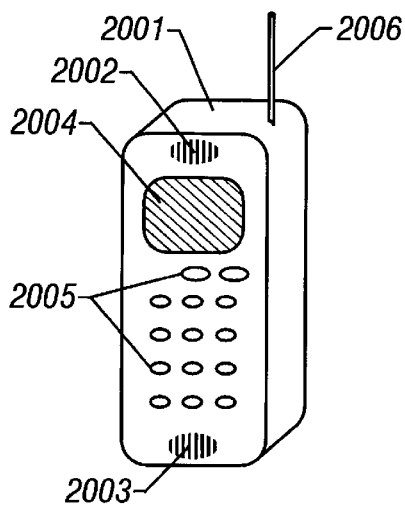
FIGS. 21A–21F show the configurations of electronic apparatuses according to a twenty-first embodiment of the invention.

FIG. 21A shows a cellular telephone, which is composed of a main body 2001, a voice output section 2002, a voice input section 2003, a display device 2004, manipulation switches 2005, and an antenna 2006. The invention can be applied to the voice output section 2002, the voice input section 2003, and the display device 2004, etc.

Figure 21B:
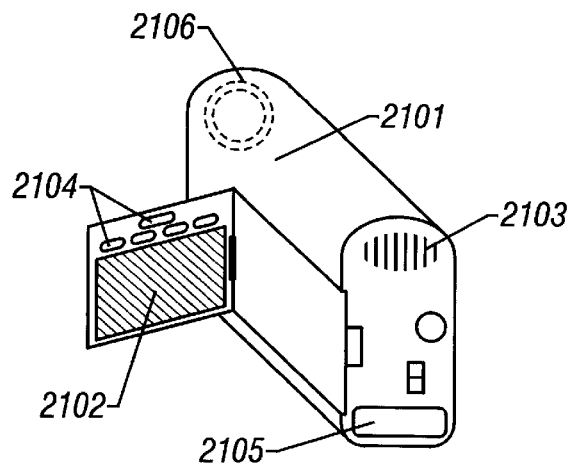

FIG. 21B shows a video camera, which is composed of a main body 2101, a display device 2102, a sound input section 2103, manipulation switches 2104, a battery 2105, and an image receiving section 2106. The invention can be applied to the display device 2102, the sound input section 2103, and the image receiving section 2106.

Figure 21C:
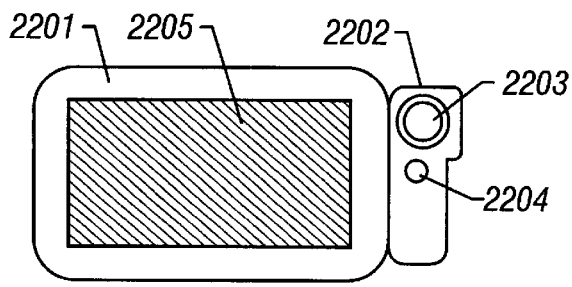

FIG. 21C shows a mobile computer, which is composed of a main body 2201, a camera section 2202, an image receiving section 2203, a manipulation switch 2204, and a display device 2205. The invention can be applied to the image receiving section 2203, the display device 2205, etc.

Figure 21D:
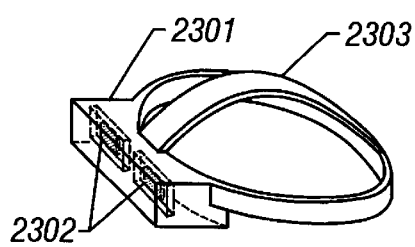

FIG. 21D shows a head-mounted display, which is composed of a main body 2301, display devices 2302, and a band section 2303. The invention can be applied to the display devices 2302.

Figure 21E:
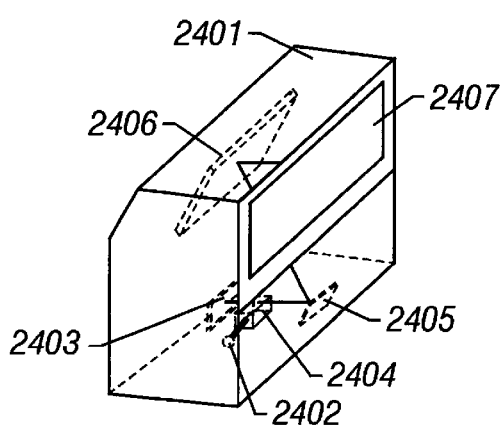

FIG. 21E shows a rear projector, which is composed of a main body 2401, a light source 2402, a display device 2403, a polarizing beam splitter 2404, reflectors 2405 and 2406, and a screen 2407. The invention can be applied to the display device 2403.

Figure 21F:
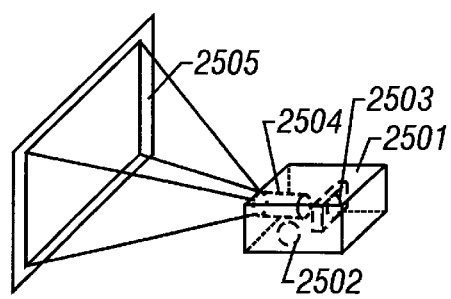

FIG. 21F shows a front projector, which is composed of a main body 2501, a light source 2502, a display device 2503, an optical system 2504, and a screen 2505. The invention can be applied to the display device 2503.

As described above, the application range of the invention is extremely wide and the invention can be applied to electronic apparatuses of every field. The invention can also be applied to an electric scoreboard and a display for advertisement.

As described above, the threshold voltage of a bottom-gate TFT can be controlled effectively by utilizing the invention. Various electro-optical devices and electronic apparatuses can be realized by using such semiconductor devices.

What is claimed is:

1. A method of processing signals by a system,
said system comprising:
   a display device;
   an active matrix portion being formed over a first substrate;
   a source side driver circuit portion over the first substrate;
   a gate side driver circuit portion over the first substrate;
   at least a terminal for transmitting an external signal to the source side driver circuit portion and the gate side driver portion, said terminal being formed over the first substrate;
   at least an IC chip portion being formed over the first substrate;
   an A/D converter being formed in the IC chip portion;
   a VRAM being formed in the IC chip portion;
   a correction+tone reverse circuit being formed in the IC chip portion;
   a D/A converter being formed in the IC chip portion;
   a clock generator being formed in the IC chip portion;
   a controlling microcomputer being formed in the IC chip portion;
said method comprising the steps of:
   externally transferring an analog signal;
   outputting the analog signal through the A/D converter, the VRAM, the correction+tone reverse circuit and the D/A converter;
   generating at least one of a clock pulse or a start pulse in the clock generator being based on a horizontal synchronizing signal and a vertical synchronizing signal;
   transferring at least one of the clock pulse or the start pulse to the A/D converter, the VRAM, the correction+tone reverse circuit and the D/A converter;
   outputting the analog signal to the source side driver circuit portion.

2. A method according to claim 1,
wherein the source side driver circuit portion includes at least one selected from the group consisting of a shift register circuit, a sampling circuit, a buffer circuit and a level shift circuit, while the gate side driver circuit portion includes at least one selected from the group consisting of a shift register and a buffer circuit.

3. A method according to claim 1,
wherein at least one selected from the group consisting the active matrix circuit portion, the source side driver circuit portion and the gate side driver circuit portion includes at least a bottom-gate n-channel thin film transistor,
said bottom-gate n-channel thin film transistor comprising:
   a gate electrode being formed on an insulating surface;
   a semiconductor island being formed over the gate electrode having a gate insulating film interposed therebetween;
   a source region, a drain region and a channel forming region being formed between the source and drain region, each of the source, drain and channel forming regions being formed in the semiconductor island;
   a buffer layer being formed over the semiconductor island,
   wherein an impurity element is intentionally introduced into the channel forming region, said impurity element being for controlling a threshold voltage of the bottom-gate n-channel thin film transistor,
   wherein a first portion of the channel forming region is defined in the vicinity of a surface on a side farther from the insulating surface, while a second portion of the channel region is defined in the vicinity of an interface between the channel forming region and the gate insulating film,
   wherein a concentration of the impurity element in the channel forming region decreases from the first portion to the second portion of the channel forming region.

4. A method according to claim 3,
wherein the impurity element is one selected from Group 13 elements and Group 15 elements,
wherein the Group 13 element is one selected from the group consisting of boron and indium, and the Group 15 element is one selected form the group consisting phosphorus, arsenic, and antimony.

5. A method according to claim 3,
wherein a concentration of the impurity element is in a range of $1 \times 10^{17}$ to $1 \times 10^{20}$ atoms/cm$^3$ in the first portion of the channel forming region.

6. A method according to claim 1,
wherein at least one selected from the group consisting of the active matrix circuit portion, the source side driver circuit portion and the gate side driver circuit portion includes at least a bottom-gate n-channel thin film transistor and at least a bottom-gate p-channel thin film transistor each being formed on an insulating surface;
said bottom-gate n-channel thin film transistor including:
   a first gate electrode being formed on the insulating surface;
   a first semiconductor island being formed over the first gate electrode having a first gate insulating film interposed therebetween;
   a first source region, a first drain region and a first channel forming region being formed between the first source and drain region, each of the first source, drain and channel forming regions being formed in the first semiconductor island;
a first buffer layer being formed over the first semiconductor island;
said bottom-gate p-channel thin film transistor including:
a second gate electrode being formed on the insulating surface;
a second semiconductor island being formed over the second gate electrode having a second gate insulating film interposed therebetween;
a second source region, a second drain region and a second channel forming region being formed between the second source and drain region, each of the second source, drain and channel forming regions being formed in the second semiconductor island;
a second buffer layer being formed over the second semiconductor island,
wherein a first impurity element selected form Group 15 elements is intentionally introduced into the first channel forming region of the n-channel thin film transistor,
wherein a second impurity element selected form Group 13 elements is intentionally introduced into the second channel forming region of the p-channel thin film transistor,
wherein a first portion of the first channel forming region is defined in the vicinity of a surface on a side farther from the insulating surface, while a second portion of the first channel region is defined in the vicinity of an interface between the first channel forming region and the first gate insulating film,
wherein a first concentration of the first impurity element in the first channel forming region of the n-channel thin film transistor decreases from the first portion to the second portion of the first channel forming region of the n-channel thin film transistor,
wherein a third portion of the second channel forming region is defined in the vicinity of a surface on a side farther from the insulating surface, while a fourth portion of the second channel region is defined in the vicinity of an interface between the second channel forming region and the second gate insulating film,
wherein a second concentration of the second impurity element in the second channel forming region of the p-channel thin film transistor decreases from the third portion to fourth portion of the second channel forming region of the p-channel thin film transistor.

7. A method according to claim 6,
wherein the first element is one selected from the group consisting of phosphorus, arsenic, and antimony, and
wherein the second element is one selected from the group consisting of boron, indium, and gallium.

8. A device according to claim 6,
wherein a first concentration of the first element in the n-channel thin film transistor is in a range of $1 \times 10^{17}$ to $1 \times 10^{20}$ atoms/cm$^3$ in the first portion of the first channel forming region, and
wherein a second concentration of the second element in the p-channel thin film transistor is in a range of $1 \times 10^{17}$ to $1 \times 10^{20}$ atoms/cm$^3$ in the third portion of the second channel forming region.

9. A method of processing signals by a system,
said system comprising:
a display device;
an active matrix portion being formed over a first substrate;
a source side driver circuit portion over the first substrate;
a gate side driver circuit portion over the first substrate;
at least a terminal for transmitting an external signal to the source side driver circuit portion and the gate side driver portion, said terminal being formed over the first substrate;
at least an IC chip portion being formed over the first substrate;
a digital signal processor being formed in the IC chip portion;
a flash memory being formed in the IC chip portion;
a VRAM being formed in the IC chip portion;
a correction+tone reverse circuit being formed in the IC chip portion;
a clock generator being formed in the IC chip portion;
a controlling microcomputer being formed in the IC chip portion;
said method comprising the steps of:
performing a correction processing for a digital signal in the digital signal processor;
reading out correction data being stored in the flash memory;
processing the digital signal under the correction processing in the VRAM and the correction+tone reverse circuit;
transferring the digital signal to the source side driver circuit portion.

10. A method according to claim 9,
wherein the source side driver circuit portion includes at least one selected from the group consisting of a shift register circuit, a sampling circuit, a buffer circuit and a level shift circuit, while the gate side driver circuit portion includes at least one selected from the group consisting of a shift register and a buffer circuit.

11. A method according to claim 9,
wherein at least one selected from the group consisting the active matrix circuit portion, the source side driver circuit portion and the gate side driver circuit portion includes at least a bottom-gate n-channel thin film transistor,
said bottom-gate n-channel thin film transistor comprising:
a gate electrode being formed on an insulating surface;
a semiconductor island being formed over the gate electrode having a gate insulating film interposed therebetween;
a source region, a drain region and a channel forming region being formed between the source and drain region, each of the source, drain and channel forming regions being formed in the semiconductor island;
a buffer layer being formed over the semiconductor island,
wherein an impurity element is intentionally introduced into the channel forming region, said impurity element being for controlling a threshold voltage of the bottom-gate n-channel thin film transistor,
wherein a first portion of the channel forming region is defined in the vicinity of a surface on a side farther from the insulating surface, while a second portion of the channel region is defined in the vicinity of an interface between the channel forming region and the gate insulating film,
wherein a concentration of the impurity element in the channel forming region decreases from the first portion to the second portion of the channel forming region.

12. A method according to claim 11,
wherein the impurity element is one selected from Group 13 elements and Group 15 elements,
wherein the Group 13 element is one selected from the group consisting of boron and indium, and the Group 15 element is one selected form the group consisting phosphorus, arsenic, and antimony.

13. A method according to claim 11,
wherein a concentration of the impurity element is in a range of $1\times10^{17}$ to $1\times10^{20}$ atoms/cm$^3$ in the first portion of the channel forming region.

14. A method according to claim 9,
wherein at least one selected from the group consisting of the active matrix circuit portion, the source side driver circuit portion and the gate side driver circuit portion includes at least a bottom-gate n-channel thin film transistor and at least a bottom-gate p-channel thin film transistor each being formed on an insulating surface;
said bottom-gate n-channel thin film transistor including:
a first gate electrode being formed on the insulating surface;
a first semiconductor island being formed over the first gate electrode having a first gate insulating film interposed therebetween;
a first source region, a first drain region and a first channel forming region being formed between the first source and drain region, each of the first source, drain and channel forming regions being formed in the first semiconductor island;
a first buffer layer being formed over the first semiconductor island;
said bottom-gate p-channel thin film transistor including:
a second gate electrode being formed on the insulating surface;
a second semiconductor island being formed over the second gate electrode having a second gate insulating film interposed therebetween;
a second source region, a second drain region and a second channel forming region being formed between the second source and drain region, each of the second source, drain and channel forming regions being formed in the second semiconductor island;
a second buffer layer being formed over the second semiconductor island,
wherein a first impurity element selected form Group 15 elements is intentionally introduced into the first channel forming region of the n-channel thin film transistor,
wherein a second impurity element selected form Group 13 elements is intentionally introduced into the second channel forming region of the p-channel thin film transistor,
wherein a first portion of the first channel forming region is defined in the vicinity of a surface on a side farther from the insulating surface, while a second portion of the first channel region is defined in the vicinity of an interface between the first channel forming region and the first gate insulating film,
wherein a first concentration of the first impurity element in the first channel forming region of the n-channel thin film transistor decreases from the first portion to the second portion of the first channel forming region of the n-channel thin film transistor,
wherein a third portion of the second channel forming region is defined in the vicinity of a surface on a side farther from the insulating surface, while a fourth portion of the second channel region is defined in the vicinity of an interface between the second channel forming region and the second gate insulating film,
wherein a second concentration of the second impurity element in the second channel forming region of the p-channel thin film transistor decreases from the third portion to fourth portion of the second channel forming region of the p-channel thin film transistor.

15. A method according to claim 14,
wherein the first element is one selected from the group consisting of phosphorus, arsenic, and antimony, and
wherein the second element is one selected from the group consisting of boron, indium, and gallium.

16. A device according to claim 14,
wherein a first concentration of the first element in the n-channel thin film transistor is in a range of $1\times10^{17}$ to $1\times10^{20}$ atoms/cm$^3$ in the first portion of the first channel forming region, and
wherein a second concentration of the second element in the p-channel thin film transistor is in a range of $1\times10^{17}$ to $1\times10^{20}$ atoms/cm$^3$ in the third portion of the second channel forming region.

17. A system comprising:
a display device;
an active matrix portion being formed over a first substrate;
a source side driver circuit portion over the first substrate;
a gate side driver circuit portion over the first substrate;
at least a terminal for transmitting an external signal to the source side driver circuit portion and the gate side driver portion, said terminal being formed over the first substrate;
at least an IC chip portion being formed over the first substrate;
an A/D converter being formed in the IC chip portion;
a VRAM being formed in the IC chip portion and electrically contacted to the A/D converter;
a correction+tone reverse circuit being formed in the IC chip portion and electrically contacted to the VRAM;
a D/A converter being formed in the IC chip portion and electrically contacted to the correction+tone reverse circuit and the source side driver circuit portion;
a clock generator being formed in the IC chip portion;
a controlling microcomputer being formed in the IC chip portion.

18. A system according to claim 17,
wherein the source side driver circuit portion includes at least one selected from the group consisting of a shift register circuit, a sampling circuit, a buffer circuit and a level shift circuit, while the gate side driver circuit portion includes at least one selected from the group consisting of a shift register and a buffer circuit.

19. A system according to claim 17,
wherein at least one selected from the group consisting the active matrix circuit portion, the source side driver circuit portion and the gate side driver circuit portion includes at least a bottom-gate n-channel thin film transistor,
said bottom-gate n-channel thin film transistor comprising:
a gate electrode being formed on an insulating surface;
a semiconductor island being formed over the gate electrode having a gate insulating film interposed therebetween;

a source region, a drain region and a channel forming region being formed between the source and drain region, each of the source, drain and channel forming regions being formed in the semiconductor island;

a buffer layer being formed over the semiconductor island, wherein an impurity element is intentionally introduced into the channel forming region, said impurity element being for controlling a threshold voltage of the bottom-gate n-channel thin film transistor, wherein a first portion of the channel forming region is defined in the vicinity of a surface on a side farther from the insulating surface, while a second portion of the channel region is defined in the vicinity of an interface between the channel forming region and the gate insulating film, wherein a concentration of the impurity element in the channel forming region decreases from the first portion to the second portion of the channel forming region.

20. A system according to claim 19, wherein the impurity element is one selected from Group 13 elements and Group 15 elements, wherein the Group 13 element is one selected from the group consisting of boron and indium, and the Group 15 element is one selected form the group consisting phosphorus, arsenic, and antimony.

21. A system according to claim 19, wherein a concentration of the impurity element is in a range of $1 \times 10^{17}$ to $1 \times 10^{20}$ atoms/cm$^3$ in the first portion of the channel forming region.

22. A system according to claim 17, wherein at least one selected from the group consisting of the active matrix circuit portion, the source side driver circuit portion and the gate side driver circuit portion includes at least a bottom-gate n-channel thin film transistor and at least a bottom-gate p-channel thin film transistor each being formed on an insulating surface;

said bottom-gate n-channel thin film transistor including:
   a first gate electrode being formed on the insulating surface;
   a first semiconductor island being formed over the first gate electrode having a first gate insulating film interposed therebetween;
   a first source region, a first drain region and a first channel forming region being formed between the first source and drain region, each of the first source, drain and channel forming regions being formed in the first semiconductor island;
   a first buffer layer being formed over the first semiconductor island;

said bottom-gate p-channel thin film transistor including:
   a second gate electrode being formed on the insulating surface;
   a second semiconductor island being formed over the second gate electrode having a second gate insulating film interposed therebetween;
   a second source region, a second drain region and a second channel forming region being formed between the second source and drain region, each of the second source, drain and channel forming regions being formed in the second semiconductor island;
   a second buffer layer being formed over the second semiconductor island, wherein a first impurity element selected form Group 15 elements is intentionally introduced into the first channel forming region of the n-channel thin film transistor, wherein a second impurity element selected form Group 13 elements is intentionally introduced into the second channel forming region of the p-channel thin film transistor, wherein a first portion of the first channel forming region is defined in the vicinity of a surface on a side farther from the insulating surface, while a second portion of the first channel region is defined in the vicinity of an interface between the first channel forming region and the first gate insulating film, wherein a first concentration of the first impurity element in the first channel forming region of the n-channel thin film transistor decreases from the first portion to the second portion of the first channel forming region of the n-channel thin film transistor, wherein a third portion of the second channel forming region is defined in the vicinity of a surface on a side farther from the insulating surface, while a fourth portion of the second channel region is defined in the vicinity of an interface between the second channel forming region and the second gate insulating film, wherein a second concentration of the second impurity element in the second channel forming region of the p-channel thin film transistor decreases from the third portion to fourth portion of the second channel forming region of the p-channel thin film transistor.

23. A system according to claim 22, wherein the first element is one selected from the group consisting of phosphorus, arsenic, and antimony, and wherein the second element is one selected from the group consisting of boron, indium, and gallium.

24. A system according to claim 22, wherein a first concentration of the first element in the n-channel thin film transistor is in a range of $1 \times 10^{17}$ to $1 \times 10^{20}$ atoms/cm$^3$ in the first portion of the first channel forming region, and wherein a second concentration of the second element in the p-channel thin film transistor is in a range of $1 \times 10^{17}$ to $1 \times 10^{20}$ atoms/cm$^3$ in the third portion of the second channel forming region.

25. A system comprising:

a display device;

an active matrix portion being formed over a first substrate;

a source side driver circuit portion over the first substrate;

a gate side driver circuit portion over the first substrate;

at least a terminal for transmitting an external signal to the source side driver circuit portion and the gate side driver portion, said terminal being formed over the first substrate;

at least an TO chip portion being formed over the first substrate;

a digital signal processor being formed in the IC chip portion;

a flash memory being formed in the IC chip portion and electrically contacted to the digital signal processor;

a VRAM being formed in the IC chip portion and electrically contacted to the digital signal processor;

a correction+tone reverse circuit being formed in the IC chip portion and electrically contacted to the VRAM and the source side driver circuit portion;

a clock generator being formed in the IC chip portion;

a controlling microcomputer being formed in the IC chip portion.

26. A system according to claim 25,
wherein the source side driver circuit portion includes at least one selected from the group consisting of a shift register circuit, a sampling circuit, a buffer circuit and a level shift circuit, while the gate side driver circuit portion includes at least one selected from the group consisting of a shift register and a buffer circuit.

27. A system according to claim 25,
wherein at least one selected from the group consisting the active matrix circuit portion, the source side driver circuit portion and the gate side driver circuit portion includes at least a bottom-gate n-channel thin film transistor,
said bottom-gate n-channel thin film transistor comprising:
  a gate electrode being formed on an insulating surface;
  a semiconductor island being formed over the gate electrode having a gate insulating film interposed therebetween;
  a source region, a drain region and a channel forming region being formed between the source and drain region, each of the source, drain and channel forming regions being formed in the semiconductor island;
  a buffer layer being formed over the semiconductor island,
  wherein an impurity element is intentionally introduced into the channel forming region, said impurity element being for controlling a threshold voltage of the bottom-gate n-channel thin film transistor,
  wherein a first portion of the channel forming region is defined in the vicinity of a surface on a side farther from the insulating surface, while a second portion of the channel region is defined in the vicinity of an interface between the channel forming region and the gate insulating film,
  wherein a concentration of the impurity element in the channel forming region decreases from the first portion to the second portion of the channel forming region.

28. A system according to claim 27,
wherein the impurity element is one selected from Group 13 elements and Group 15 elements,
wherein the Group 13 element is one selected from the group consisting of boron and indium, and the Group 15 element is one selected form the group consisting phosphorus, arsenic, and antimony.

29. A system according to claim 27,
wherein a concentration of the impurity element is in a range of $1\times10^{17}$ to $1\times10^{20}$ atoms/cm$^3$ in the first portion of the channel forming region.

30. A system according to claim 25,
wherein at least one selected from the group consisting of the active matrix circuit portion, the source side driver circuit portion and the gate side driver circuit portion includes at least a bottom-gate n-channel thin film transistor and at least a bottom-gate p-channel thin film transistor each being formed on an insulating surface;
said bottom-gate n-channel thin film transistor including:
  a first gate electrode being formed on the insulating surface;
  a first semiconductor island being formed over the first gate electrode having a first gate insulating film interposed therebetween;
  a first source region, a first drain region and a first channel forming region being formed between the first source and drain region, each of the first source, drain and channel forming regions being formed in the first semiconductor island;
  a first buffer layer being formed over the first semiconductor island;
said bottom-gate p-channel thin film transistor including:
  a second gate electrode being formed on the insulating surface;
  a second semiconductor island being formed over the second gate electrode having a second gate insulating film interposed therebetween;
  a second source region, a second drain region and a second channel forming region being formed between the second source and drain region, each of the second source, drain and channel forming regions being formed in the second semiconductor island;
  a second buffer layer being formed over the second semiconductor island,
wherein a first impurity element selected form Group 15 elements is intentionally introduced into the first channel forming region of the n-channel thin film transistor,
wherein a second impurity element selected form Group 13 elements is intentionally introduced into the second channel forming region of the p-channel thin film transistor,
wherein a first portion of the first channel forming region is defined in the vicinity of a surface on a side farther from the insulating surface, while a second portion of the first channel region is defined in the vicinity of an interface between the first channel forming region and the first gate insulating film,
wherein a first concentration of the first impurity element in the first channel forming region of the n-channel thin film transistor decreases from the first portion to the second portion of the first channel forming region of the n-channel thin film transistor,
wherein a third portion of the second channel forming region is defined in the vicinity of a surface on a side farther from the insulating surface, while a fourth portion of the second channel region is defined in the vicinity of an interface between the second channel forming region and the second gate insulating film,
wherein a second concentration of the second impurity element in the second channel forming region of the p-channel thin film transistor decreases from the third portion to fourth portion of the second channel forming region of the p-channel thin film transistor.

31. A system according to claim 30,
wherein the first element is one selected from the group consisting of phosphorus, arsenic, and antimony, and
wherein the second element is one selected from the group consisting of boron, indium, and gallium.

32. A system according to claim 30,
wherein a first concentration of the first element in the n-channel thin film transistor is in a range of $1\times10^{17}$ to $1\times10^{20}$ atoms/cm$^3$ in the first portion of the first channel forming region, and
wherein a second concentration of the second element in the p-channel thin film transistor is in a range of $1\times10^{17}$ to $1\times10^{20}$ atoms/cm$^3$ in the third portion of the second channel forming region.

* * * * *